(12) United States Patent
Sugahara et al.

(10) Patent No.: US 7,553,778 B2
(45) Date of Patent: Jun. 30, 2009

(54) METHOD FOR PRODUCING A SEMICONDUCTOR DEVICE INCLUDING CRYSTALLIZING AN AMPHOROUS SEMICONDUCTOR FILM

(75) Inventors: Kazuyuki Sugahara, Tokyo (JP); Naoki Nakagawa, Tokyo (JP); Atsuhiro Sono, Tokyo (JP); Shinsuke Yura, Tokyo (JP); Kazushi Yamayoshi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 335 days.

(21) Appl. No.: 11/356,288

(22) Filed: Feb. 17, 2006

(65) Prior Publication Data
US 2006/0183304 A1 Aug. 17, 2006

(30) Foreign Application Priority Data
Feb. 17, 2005 (JP) ............................. 2005-040347
Nov. 23, 2005 (JP) ............................. 2005-337903

(51) Int. Cl.
*H01L 21/00* (2006.01)
(52) U.S. Cl. ..................... 438/795; 438/487; 257/75; 257/E21.471; 257/E21.475; 257/E21.328
(58) Field of Classification Search .......... 438/799, 438/487, 488, 489; 257/75, E21.475, E21.471, 257/E21.328
See application file for complete search history.

(56) References Cited

U.S. PATENT DOCUMENTS

| 6,194,023 | B1 * | 2/2001 | Mitsuhashi et al. ............ 427/8 |
| 6,566,683 | B1 | 5/2003 | Ogawa et al. |
| 6,717,105 | B1 | 4/2004 | Okamoto et al. |
| 6,884,699 | B1 | 4/2005 | Ogawa et al. |
| 6,903,368 | B2 * | 6/2005 | Yamaguchi et al. ........... 257/57 |
| 2001/0026835 | A1 | 10/2001 | Tanaka |
| 2001/0036755 | A1 | 11/2001 | Tanaka |
| 2002/0052069 | A1 * | 5/2002 | Jiroku et al. ................. 438/166 |
| 2003/0038122 | A1 * | 2/2003 | Yamazaki et al. ...... 219/121.76 |
| 2006/0183303 | A1 * | 8/2006 | Inui et al. ................... 438/487 |
| 2007/0141733 | A1 * | 6/2007 | Shimomura et al. ........... 438/14 |

FOREIGN PATENT DOCUMENTS

| EP | 1 256 977 | 11/2002 |
| JP | 2001-338873 | 12/2000 |
| JP | 2002-016015 | 12/2000 |
| WO | WO 02/31871 | 4/2002 |

\* cited by examiner

*Primary Examiner*—Caridad M Everhart
(74) *Attorney, Agent, or Firm*—Leydig, Voit & Mayer, Ltd.

(57) ABSTRACT

A method for producing a semiconductor device includes irradiating an amorphous semiconductor film on an insulating material with a pulsed laser beam having a rectangular irradiation area, while scanning in a direction intersecting a longitudinal direction of the irradiation area, thereby forming a first polycrystalline semiconductor film, and irradiating a part of the amorphous semiconductor film with the laser beam, while scanning in a longitudinal direction intersecting the irradiation area, the part superposing the first polycrystalline semiconductor film and being adjacent to the first polycrystalline semiconductor film, thereby forming a second polycrystalline semiconductor film. The laser beam has a wavelength in a range from 390 nm to 640 nm, and the amorphous semiconductor film has a thickness in a range from 60 nm to 100 nm.

13 Claims, 16 Drawing Sheets

METHOD FOR PRODUCING A SEMICONDUCTOR DEVICE INCLUDING CRYSTALLIZING AN AMPHOROUS SEMICONDUCTOR FILM

BACKGROUND OF THE INVENTION

1. Field of the Invention

The present invention relates to a semiconductor device which is suitably used in display devices such as liquid crystal displays and to a method for producing the same.

2. Description of the Related Art

In liquid crystal displays, an active matrix type liquid crystal display device for displaying an image by switching by a thin film transistor (TFT) using an amorphous or polycrystalline silicon film formed on a glass or synthetic quartz substrate is the main current. At present, this liquid crystal panel is mainly driven by using a driver circuit which drives pixel transistors as independently set up externally. If this driver circuit could be constructed on the same substrate as in a pixel circuit of the liquid crystal display, it should become possible to obtain tremendous merits in view of the manufacturing costs of liquid crystal displays, reliability and so on.

However, at present, since crystallinity of a silicon film which constructs an active layer of TFT is poor, performance of TFT represented by mobility of a carrier is low so that it is difficult to prepare integrated circuits requiring high speed properties and high functionality, such as driver circuits. For the purpose of realizing TFT having a carrier with high mobility, in order to improve crystallinity of the silicon film, it is generally performed to thermally treat the silicon film with a laser.

The relationship between the crystallinity of the silicon film and the carrier mobility in TFT will be hereunder described. That is, a silicon film obtained by a laser heat treatment of an amorphous silicon film is generally a polycrystalline substance. In the grain boundary of the polycrystalline substance, a crystal defect is localized. This hinders the carrier movement of the active layer of TFT. Accordingly, in order to enhance the mobility in TFT, it is only required that not only the number of crossing the grain boundary during the movement of the carrier within the active layer is made small, but also a density of the crystal defect is made small. An object of the laser heat treatment is to form a polycrystalline silicon film which is large in crystal grain size and small in crystal defect in the grain boundary.

Next, a conventional production method of TFT will be described below. First of all, for example, a silicon oxide film is formed on a glass substrate by plasma CVD (chemical vapor deposition process). For example, an amorphous silicon film is deposited on this silicon oxide film by plasma CVD.

Subsequently, an excimer laser (XeCl (wavelength: 308 nm)) or a second harmonic of Nd:YAG laser (hereinafter referred to as "YAG2ω") (wavelength: 532 nm) is irradiated on the amorphous silicon film. By this laser irradiation, a portion irradiated with a laser is molten. Thereafter, the molten silicon is crystallized with a decrease of the temperature, thereby forming a polycrystalline silicon film.

Thereafter, the polycrystalline silicon film is subjected to patterning. Next, a silicon oxide film and a metallic film (metallic film with low electrical resistance, such as Ta, Cr, and Mo) are formed on the polycrystalline silicon film.

Next, the metallic film is subjected to patterning, thereby forming a gate electrode. Next, N type or P type impurities are introduced into the polycrystalline silicon film by an ion doping process while making the gate electrode or a resist during forming the gate electrode act as a mask, thereby forming source and drain areas in a self-alignment manner. Thereafter, a silicon oxide film is deposited to form contact holes in the source, the drain and the gate, thereby accumulating a metallic film (for example, Al, W, and Mo). By subjecting this metallic film to patterning, wiring of the source, the drain and the gate is carried out. In this way, TFT of an n-channel type (NMOS) transistor is completed in a portion into which N type impurities are introduced, and TFT of a p-channel type (PMOS) transistor is completed in a portion into which P type impurities are introduced. An insulating film and a transparent electrode are further formed on this TFT, thereby obtaining a TFT panel. By using this TFT panel and further combining a liquid crystal, a polarized film, a color filter, etc. therewith, a liquid crystal display is completed.

As described previously, a TFT panel is formed by using a polycrystalline silicon film formed upon irradiation with a laser. At this time, an important point resides in the matter that for example, in the case of a TFT panel for mobile phone, at least the length of a beam on the elongated cross section of a laser is made longer than the short sides of the TFT panel. This is because in the case where the ends of beams are superposed by an ultraviolet laser beam such as an excimer laser, the characteristics are largely deteriorated in a superposed irradiation portion (superposing irradiation part) and the characteristics of TFT (for example, mobility and threshold voltage) are lowered (for example, see Morikawa et al., *SID 04 DIGEST*, (US), 2004, pp. 1088-1091). However, it is difficult for usual panels for television set to meet the foregoing conditions because the panel size is large.

In order to improve the characteristics of the foregoing superposing irradiation part, there is proposed a method in which a laser having a wavelength of from 390 nm to 640 nm is irradiated in a first area of an amorphous silicon film, thereby forming a first polycrystalline silicon film portion; and a laser having a wavelength of from 390 nm to 640 nm is then irradiated in an end of the first polycrystalline silicon film portion and a second area of the amorphous silicon film which comes into contact with the first polycrystalline silicon film portion, thereby forming a second polycrystalline silicon film portion so as to come into contact with the first polycrystalline silicon film portion (for example, see WO 02/31871, JP-A-2002-16015 and Morikawa et al., *SID 04 DIGEST*).

The reasons why a laser beam having the foregoing wavelength range is used are as follows.

In amorphous silicon films and polycrystalline silicon films, an absorption coefficient of laser is variously changed depending upon the wavelength. According to WO 02/31871, a wavelength of the laser is regulated at from 390 nm to 640 nm. As shown in FIG. 20, an absorption coefficient of a laser beam in the foregoing-wavelength area of 390 nm or more on a polycrystalline silicon film is not more than 60% of that of an amorphous silicon film. For that reason, if a laser is irradiated on an amorphous silicon film, whereby a polycrystalline silicon film is once formed, even when a laser having the foregoing wavelength area is again irradiated on this polycrystalline silicon film, the polycrystalline silicon film does not absorb energy of the laser beam so much as compared with the amorphous silicon film. As a result, the polycrystalline silicon film is not molten by re-irradiation, and its characteristics are not changed by the re-irradiation with a laser. For that reason, it is possible to obtain substantially homogenous characteristics over the whole of the polycrystalline silicon film.

In addition, as described previously, since the wavelength area of a laser beam is regulated at not more than 640 nm, as shown in FIG. 20, it is possible to secure an absorption coefficient of 10% or more of the amorphous silicon film. As a result, the amorphous silicon film is liable to absorb energy of a laser beam so that it becomes possible to easily achieve polycrystallization through melting.

Incidentally, as shown in FIG. 20, what the wavelength is from 500 nm to 550 nm is preferable because a difference in absorption coefficient between the amorphous silicon film and the polycrystalline silicon film becomes larger. What the wavelength is from 520 nm to 550 nm is more preferable because a difference in absorption coefficient between the amorphous silicon film and the polycrystalline silicon film becomes especially large.

In WO 02/31871, YAG2ω is used. Thus, as is clear from FIG. 20, even in the case of variously setting up the thickness of the silicon film, since the wavelength is 532 nm, the absorption coefficient in the polycrystalline silicon film is smaller than that of the amorphous silicon film.

As described previously, a pixel drive transistor of TFT is constructed of an NMOS transistor and a PMOS transistor. It is required to review how a mobility and a threshold voltage of a carrier in such transistors vary in the whole of the TFT panel. In a portion where a laser is irradiated twice (superposition part), the mobility is kept substantially uniform in all of the NMOS transistor and the PMOS transistor. Furthermore, even in the superposition part, the mobility is substantially equal to that in other portions.

In addition, even in all of the NMOS transistor and the PMOS transistor, the threshold voltage is substantially equal in all positions. This means that the threshold voltage is substantially equal in a portion where a laser is irradiated twice (superposition part) and a portion where a laser is irradiated only once.

As described previously, in an example of using a laser beam having a wavelength of 532 nm, since the wavelength of the laser beam is set up in an appropriate range, in a portion where a laser beam is irradiated once and a portion where a laser beam is irradiated twice, the mobility and the threshold voltage are uniform so that semiconductor devices with high quality can be provided.

However, when a TFT panel was actually prepared by using a laser beam having a wavelength of the foregoing preferred range, it became clear that a superposition area is delicately recognized by human eyes. This is because a human being recognizes a very delicate gradation difference. If the superposition part is recognized by human eyes, even when such does not affect display performance, there is a possibility that a commercial value is affected.

SUMMARY OF THE INVENTION

The invention provides a semiconductor device in which in a laser heat treatment process for polycrystallizing an amorphous silicon film upon irradiation with a laser beam having an elongated cross section and having a wavelength of from 390 nm to 640 nm while scanning in a direction intersecting with a longitudinal direction of the cross section, a superposition part of laser irradiation is never recognized by human eyes and a method for producing the same.

According to an aspect of the present invention, a method for producing a semiconductor device includes a first scanning step for irradiating an amorphous semiconductor film formed on an insulating material with a laser beam of pulse oscillation having a rectangular irradiation plane while scanning in a direction intersecting with a longitudinal direction of the irradiation plane thereby forming a first polycrystalline semiconductor film, and a second scanning step for irradiating a part of the amorphous semiconductor film, with the laser beam while scanning in a longitudinal direction intersecting with the irradiation plane, the part superposing the first polycrystalline semiconductor film and being adjacent to the first polycrystalline semiconductor film, thereby forming a second polycrystalline semiconductor film. The laser beam has a wavelength range of from 390 nm to 640 nm; and the amorphous semiconductor film has a thickness of from 60 nm to 100 nm.

According to the foregoing method for producing a semiconductor device, in a superposition part between the first polycrystalline semiconductor film and the second polycrystalline semiconductor film, the polycrystalline semiconductor films are liable to be molten by the second scanning step, and the polycrystalline semiconductor as formed by the one-time scanning with a laser and the polycrystalline semiconductor film in the superposition part exhibit equal properties. As a result, the subject superposition part is not recognized by human eyes, and uniform performance can be obtained with respect to transistor characteristics.

DETAILED DESCRIPTION OF THE INVENTION

First of all, a basic principle of the invention will be hereunder described on the basis of the accompanying drawings.

Figure 21:
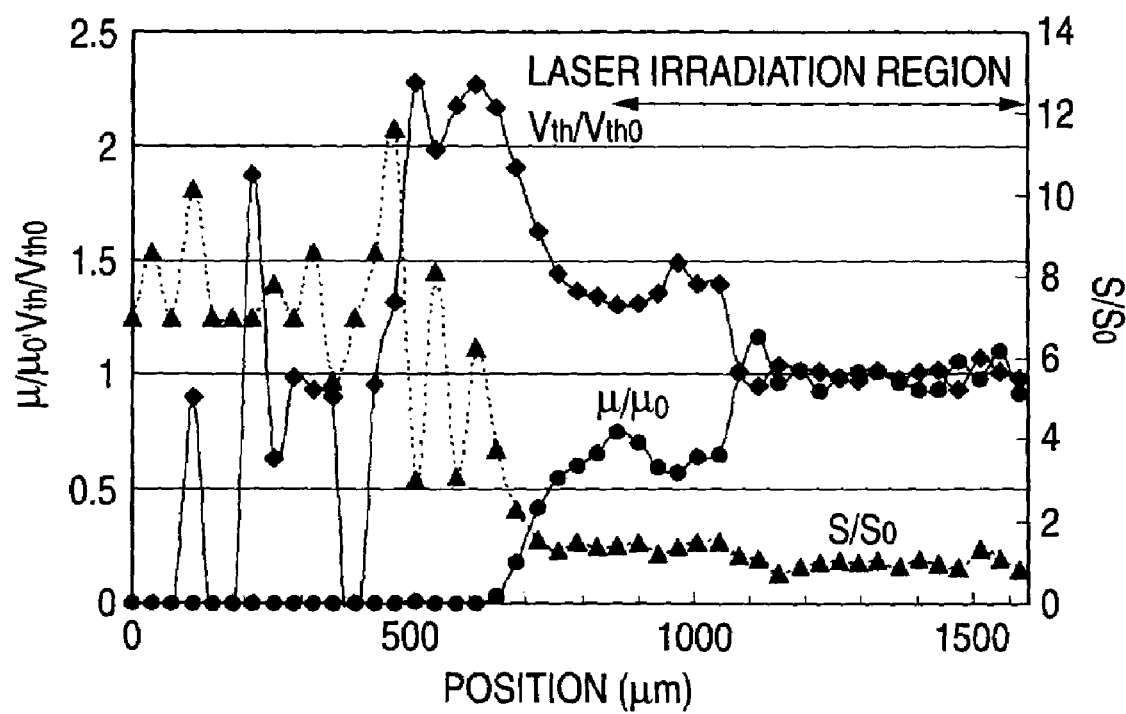
FIG. 21 is a graph to show the distribution of relative value of carrier mobility, $V_{th}$ and S value of TFT in an end part of laser beam scanning according to a conventional method.

First, the state of an end part of a laser beam of polycrystalline silicon as formed by one-time irradiation with a laser beam was evaluated in detail. FIG. 21 shows the position dependency of electrical characteristics (mobility, threshold voltage ($V_{th}$), and sub-threshold characteristic (S value: an increase of gate voltage necessary for increasing a drain current by one digit in an area where the gate voltage is not more than $V_{th}$)) of an NMOS transistor (NMOS-TFT) prepared on polycrystalline silicon which has been crystallized by scanning a YAG2ω pulse laser (wavelength: 532 nm) with an energy density of 490 mJ/cm² only once on an amorphous silicon film. The mobility, $V_{th}$ and S value are standardized by the characteristics of TFT prepared in the central part of a laser irradiation area. The YAG2ω laser was oscillated at 1 kHz and irradiated while moving a substrate at a rate of 3 μm per pulse. A number of TFTs are disposed in parallel in the long side direction of a laser beam at intervals of 36 μm. A thickness of the amorphous silicon film is 70 nm. In FIG. 21, the abscissa shows a distance from the standard position; the laser irradiation area is an area of from 900 to 1,600 μm from the standard; and an area of from 0 to 900 μm is a laser non-irradiation area. Here, the end part of the laser irradiation area is positioned at 900 μm.

It is noted from FIG. 21 that the mobility (μ) decreases from the vicinity of 200 μm in the laser irradiation area side from the end part of the laser irradiation area, increases once in the end part of the laser irradiation area and then monotonously decreases. The threshold voltage ($V_{th}$) of TFT slightly increases in the vicinity of 200 μm in the laser irradiation area side from the end part of the laser irradiation area, then further increases in the laser non-irradiation area and exhibits a maximum value at the position of 400 μm in the non-irradiation area side from the end part of the laser irradiation area. Although the S value exhibits the same tendency as in the $V_{th}$, even when separated from the laser irradiation area, the S value is high as it stands. Furthermore, while not shown in the drawing, an off current (a minimum value of the drain current at the time of changing the gate voltage from −5 V to 10 V) becomes a maximum, too at the position at which the $V_{th}$ becomes a maximum. Moreover, it is noted from FIG. 21 that an area of the silicon film where the $V_{th}$ becomes a maximum is a very narrow area having a width of about 30 μm. This is because TFTs are disposed at intervals of 36 μm. In addition, with respect to the PMOS transistor (PMOS-TFT), even in the case where the thickness of the silicon film is 50 nm, the same evaluation was carried out, thereby obtaining the same results.

Figure 22:
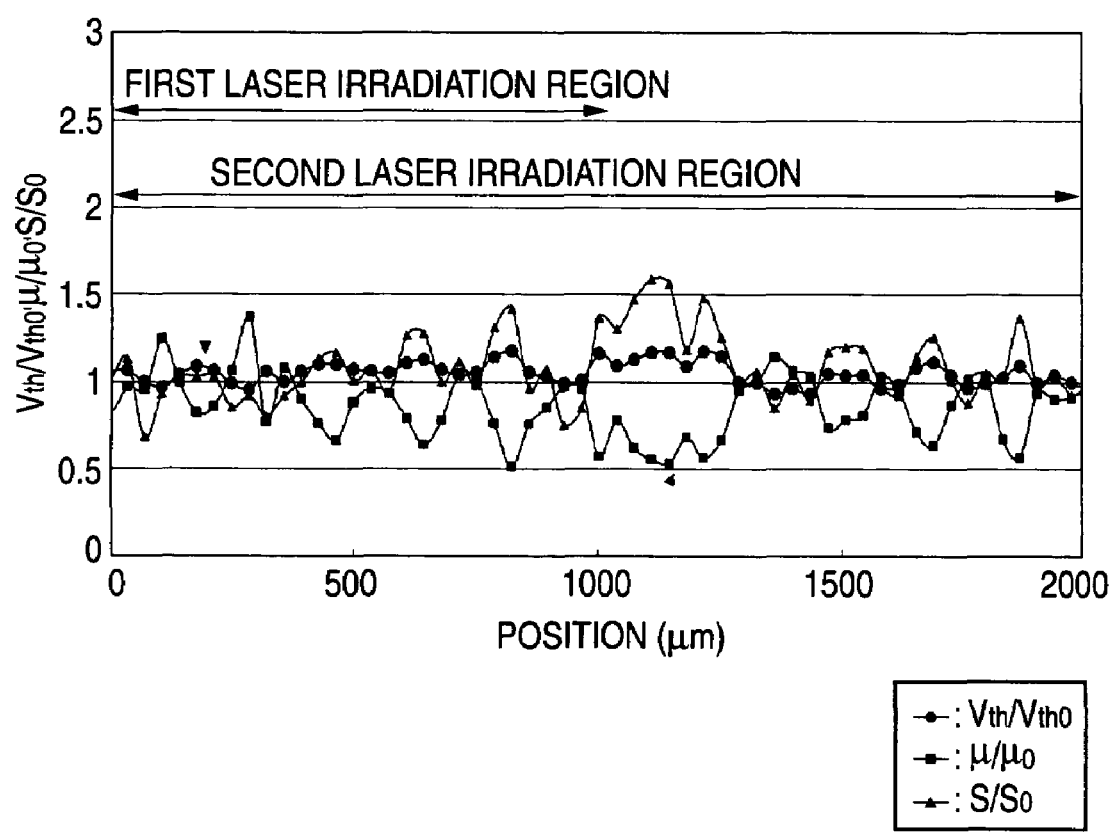
FIG. 22 is a graph to show the distribution of relative value of carrier mobility, $V_{th}$ and S value of TFT according to a conventional method.

Next, TFT was prepared in a polycrystalline silicon film resulting from crystallization by superposing the laser irradiation areas, and characteristics of the superposed portion were evaluated. FIG. 22 shows the position dependency of electrical characteristics of NMOS-TFT as prepared on a silicon film in the vicinity of an area where laser beams are superposed and irradiated on the silicon film resulting from first irradiation with a YAG2ω laser and second irradiation with the laser beam by deviating the position to be irradiated from the first irradiation area. The thickness of the silicon film was regulated at 50 nm. An energy density of the YAG2ω laser is 670 mJ/cm². One oscillation of the laser and the movement distance per pulse are the same as in the case of only one-time irradiation. In FIG. 22, the abscissa shows a distance from the standard position and is from 0 to 1,000 μm in the first laser irradiation area and from 0 to 2,000 μm in the second laser irradiation area, respectively. In other words, the area at which the laser is superposed and irradiated is from 0 to 1,000 μm.

The S value of TFT at the position of 200 μm in the laser irradiation area side and at the position of from 200 to 300 μm in the non-irradiated side from the end part of the first laser irradiation area increases, whereas the mobility is deteriorated. While not shown in the drawing, it became clear that the off current increases at the position where the mobility and the S value are deteriorated. With respect to is the $V_{th}$, there is no remarkable increase or decrease. Furthermore, it is noted that an area where the S value and the mobility are deteriorated is corresponding to an area of from one to two TFTs and is from approximately from 36 to 72 μm in terms of a distance.

In the light of the above, as a result of the detailed evaluation of the position dependency of characteristics of TFT in the end part of the laser irradiation area and the end parts of the first and second irradiation areas, it was noted that the problem that the superposition area is delicately recognized by human eyes is derived from TFT in which the mobility, S value and off current as generated in the vicinity of an area where a laser is superposed and irradiated are deteriorated. In the case of a liquid crystal display device, for example, when the mobility of TFT which drives a pixel is low, it is impossible to charge a capacitor present in the pixel to a desired voltage within a determined period of time. Furthermore, when the off current of TFT which drives the pixel, a charge as charged in the capacitor leaks within a time of one frame so that a desired voltage cannot be kept. While this deterioration amount is a small amount as approximately 1/256 gradation in terms of a quantity of light which passes through a liquid crystal, there is caused a defect which is recognized by human eyes. In addition, though an area where the characteristics are deteriorated is very narrow as from 30 to 70 μm, a pixel pitch of a TFT liquid crystal display is approximately 30 μm, and TFT is always formed in the deteriorated area. Thus, there is caused a defect which is recognized by human eyes. However, for example, in a test pattern of TFTs which are disposed at intervals of 500 μm or 250 μm, this defect cannot be detected.

Figure 1:
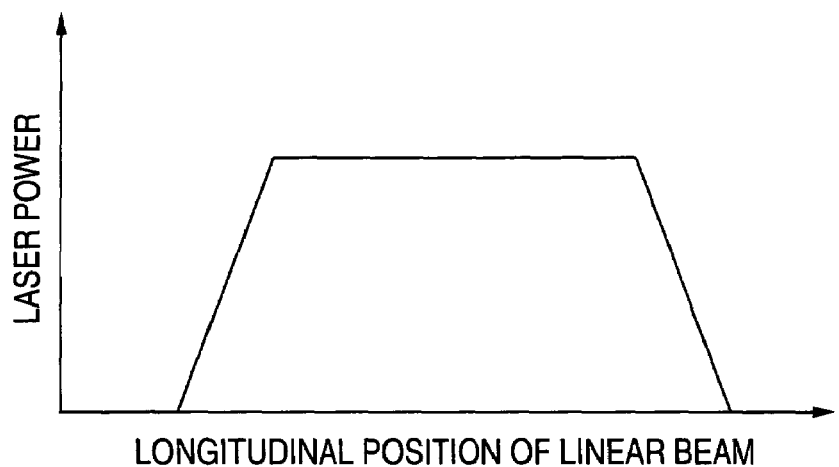
FIG. 1 is a drawing to show a light intensity distribution of a laser beam cross section in the long side direction in Embodiment 1 of the invention.

As a result of searching any cause of a slight lowering of characteristics of TFT in the vicinity of an end part of the first irradiation area in the superposition part, the following has become clear. That is, as shown in FIG. 1, the light intensity distribution in the longitudinal direction of the cross section of a laser beam having an elongated cross section is trapezoidal, and its end is decayed with a width, thereby forming an oblique area. In the case where a beam having the light intensity distribution having such a cross section is scanned and irradiated only once, an amorphous silicon film which has received a laser beam with a light intensity exceeding a melting threshold value in the foregoing oblique area is changed to a polycrystalline silicon film of a fine crystal having a very small crystal particle size. On the other hand, an amorphous silicon film which has received a laser beam with a light intensity higher than the foregoing light intensity increases the crystal particle size corresponding to an increase of the light intensity. In the polycrystalline silicon film having a small crystal particle size, the number (area) of grain boundary per unit volume is high as compared with that in the polycrystalline silicon film having a large crystal particle size. Since the grain boundary acts as a potential barrier against the carrier, in the polycrystalline silicon film having a crystal particle size, the mobility decreases, and the $V_{th}$ increases. In addition, the grain boundary also works as a trap of the carrier. In a sub-threshold area where the gate voltage is not higher than the $V_{th}$, a small number of generated carriers are trapped in the grain boundary, and a drain current is not produced. Thus, in the polycrystalline silicon film having a small crystal particle size, the S value increases. Incidentally, in the amorphous silicon film, though a crystal boundary does not exist, a very large number of unbinding bonds of a silicon atom are present. Thus, the mobility becomes a value closed to 0, whereas the S value becomes very large.

Furthermore, it has become clear that a lowering of the mobility within the laser irradiation area and slight increases of the $V_{th}$ and the S value are caused by interference of the laser beam. This will be hereunder described in detail.

Figure 2:
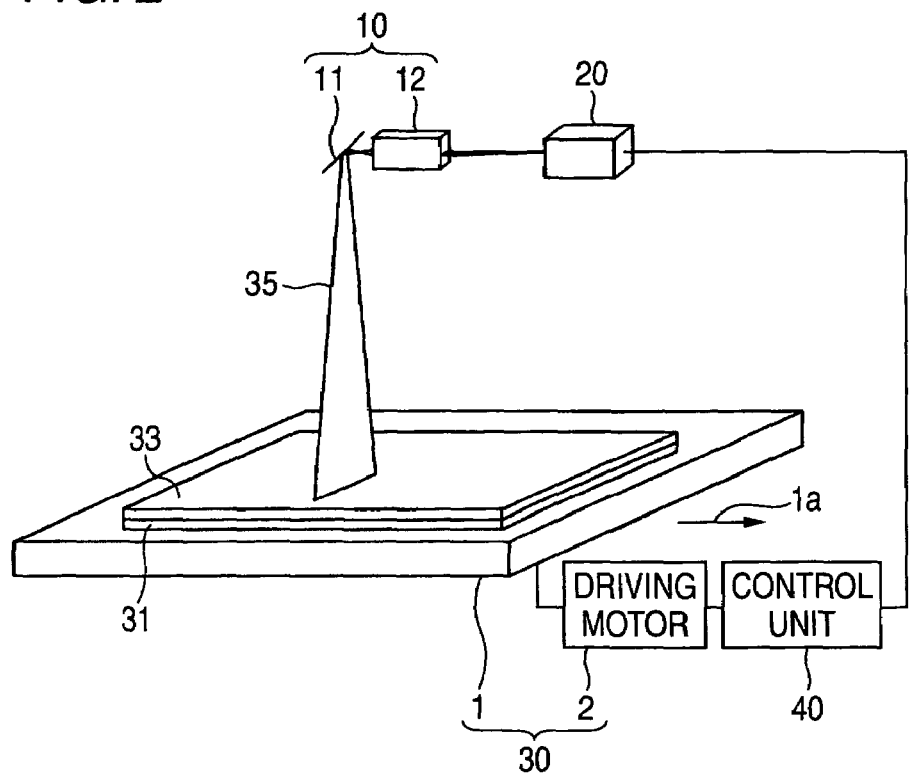
FIG. 2 is a drawing to show a laser scanning device in Embodiment 1 of the invention.

FIG. 2 shows a construction of a device for irradiating a laser on an amorphous thin film. A laser irradiation device of FIG. 2 is composed of a laser oscillator 20 which oscillates in an area of from 390 to 640 nm as in YAG2ω, etc., an irradiation unit 10 for irradiating a laser oscillated from the laser oscillator 20 on an amorphous silicon film as formed on a substrate, a movement unit 30 for moving the substrate against the irradiation unit 10, and a control unit 40 for controlling the movement unit 30 for scanning the laser.

The irradiation unit 10 is constructed of a mirror 11 and a beam forming optical system 12. The beam forming optical system 12 forms a laser beam as injected from the laser oscillator 20 into a prescribed shape (for example, a superfine beam having an elongated cross section and having a beam width in the order of from several hundreds μm to several tens μm in the beam delivery direction and a length of several hundreds mm in a direction intersecting therewith). Then, the laser as injected from the beam forming optical system 12 is reflected by the mirror 11 to become a beam 35 having a rectangular shape, which is then irradiated to an amorphous silicon film 33. Both the beam forming optical system 12 and the mirror 11 are positioned on the amorphous silicon film 33.

The movement unit 30 is constructed of a moving stage 1 and a drive motor 2 for driving the moving stage 1. The moving stage 1 supports a glass substrate 31 and is also movable against the laser oscillator 20 and the irradiation unit 10. For that reason, when the moving stage 1 moves, the glass substrate 31 and the amorphous silicon film 33 as placed thereon also move.

The moving stage 1 is connected to the drive motor 2, and the drive motor 2 drives the moving stage 1. Incidentally, the moving stage 1 is movable in any direction on a prescribed plane.

The control unit 40 is connected to the drive motor 2 and the laser oscillator 20. The control unit 40 sends a signal to the drive motor 2 so as to drive the moving stage 1 at a prescribed time. The drive motor 2 which has received this signal moves the moving stage 1 into a prescribed direction. Furthermore, the control unit 40 also sends a signal to the laser oscillator 20, thereby introducing an outgoing laser beam from the laser oscillator 20 into the beam forming optical system 12.

Figure 3:
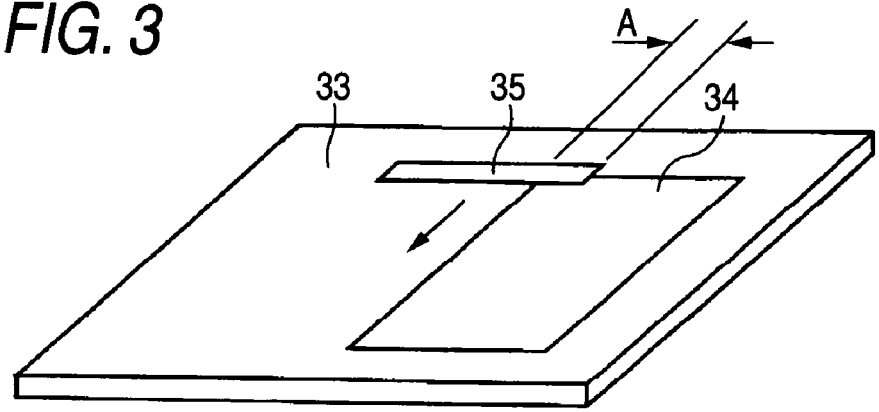
FIG. 3 is an oblique view to show a laser scanning process in Embodiment 1 of the invention.

The laser oscillator 20 oscillates a laser, and this laser is irradiated to a fixed area of an amorphous silicon film 33 as shown in FIG. 3 via the beam forming optical system 12 and the mirror 11. In this state, the control unit 40 sends a signal to the drive motor 2, and the drive motor 2 moves the moving stage 1 in a direction as shown by an arrow 1a shown in FIG. 2. On this occasion, the beam 35 as formed in an elongated shape is irradiated to the amorphous silicon film 33, and the subject portion is crystallized into a polycrystalline silicon film 34. In addition, as shown in FIG. 3, the beam 35 is irradiated such that a part (A) of the amorphous silicon film 33 superposes the polycrystalline silicon film 34. In this way, a desired portion of the amorphous silicon film 33 is crystallized together with the polycrystalline silicon film 34.

Figure 4A:
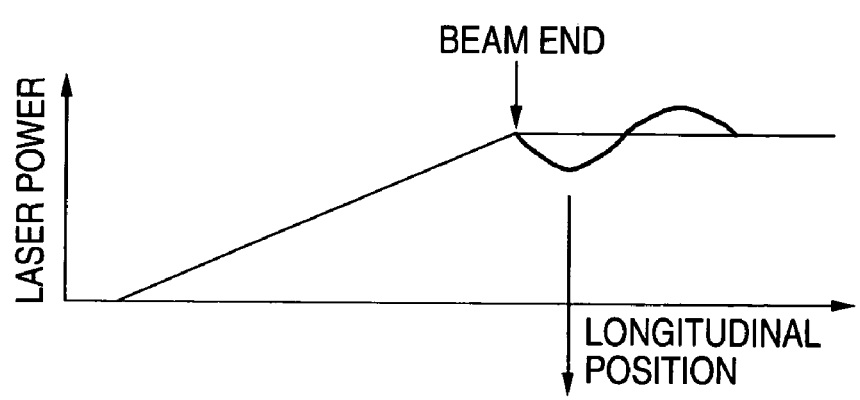
FIGS. 4A and 4B are drawings to show the correspondence of a light intensity distribution of a laser beam in the long side direction to the resulting silicon film in Embodiment 1 of the invention.

In FIG. 2, the beam forming optical system 12 divides a circular or elliptical laser beam from the laser oscillator 20 into five to ten portions and changes an optical path such that the respective portions have a rectangular beam shape. The divided beams are superposed to some extent and shaped such that a laser power in the longitudinal direction of a rectangle as shown in FIG. 1 is made uniform. At this time, since the divided beams have a different optical path length, the superposed beams cause interference. Since the end part of beam is large in a distance from the center of beam, the interference in the end part of beam becomes large. FIG. 4A is a graph to schematically show a light intensity in an end part of beam in the position of a longitudinal direction of a laser beam. In the end portion of beam, the laser beam intensity is reduced due to the interference of laser beam. In an area where the laser beam intensity becomes small due, to this interference, the crystal particle size of the silicon film becomes small. When the laser beam intensity becomes extremely small, there may be the case where crystal particles in this area become further small to form fine crystals. For that reason, the mobility, the $V_{th}$ and the S value of TFT as prepared in the inside of 200 μm of the laser irradiation area side from the end part of the laser irradiation area are deteriorated.

Figure 4B:
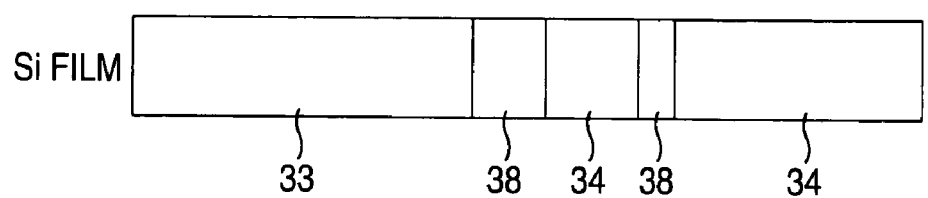
Figure 5:
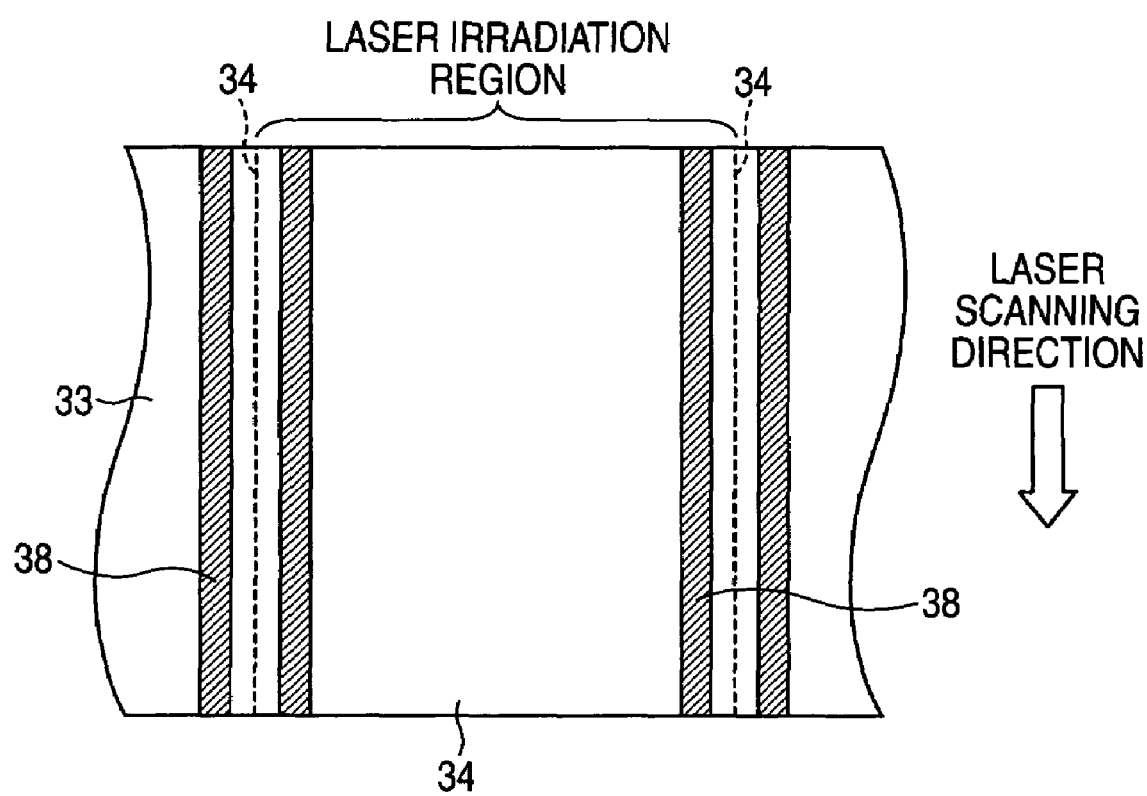
FIG. 5 is a plan view to show the crystal state of a silicon film in the case of carrying out laser beam scanning once in Embodiment 1 of the invention.

FIG. 4B shows crystallinity of a silicon film corresponding to the end part of the laser irradiation area. In the area in the inside of 200 μm and the area in the outside of from 300 to 400 μm of the laser irradiation area side, small crystal areas are formed so that characteristics of the prepared TFT are deteriorated. FIG. 5 shows a plan schematic view of crystallinity of a silicon film as formed in the case where a laser beam is scanned and irradiated only once in this way. When a laser beam is scanned and irradiated only one, the irradiated area becomes a polycrystalline silicon film 34. A small crystal area 38 is formed in the inside of 200 μm from the end part of this polycrystalline silicon film 34. A small crystal area 38 is also formed in the outside of from 300 to 400 μm from the end part of the polycrystalline silicon film 34.

Figure 20:
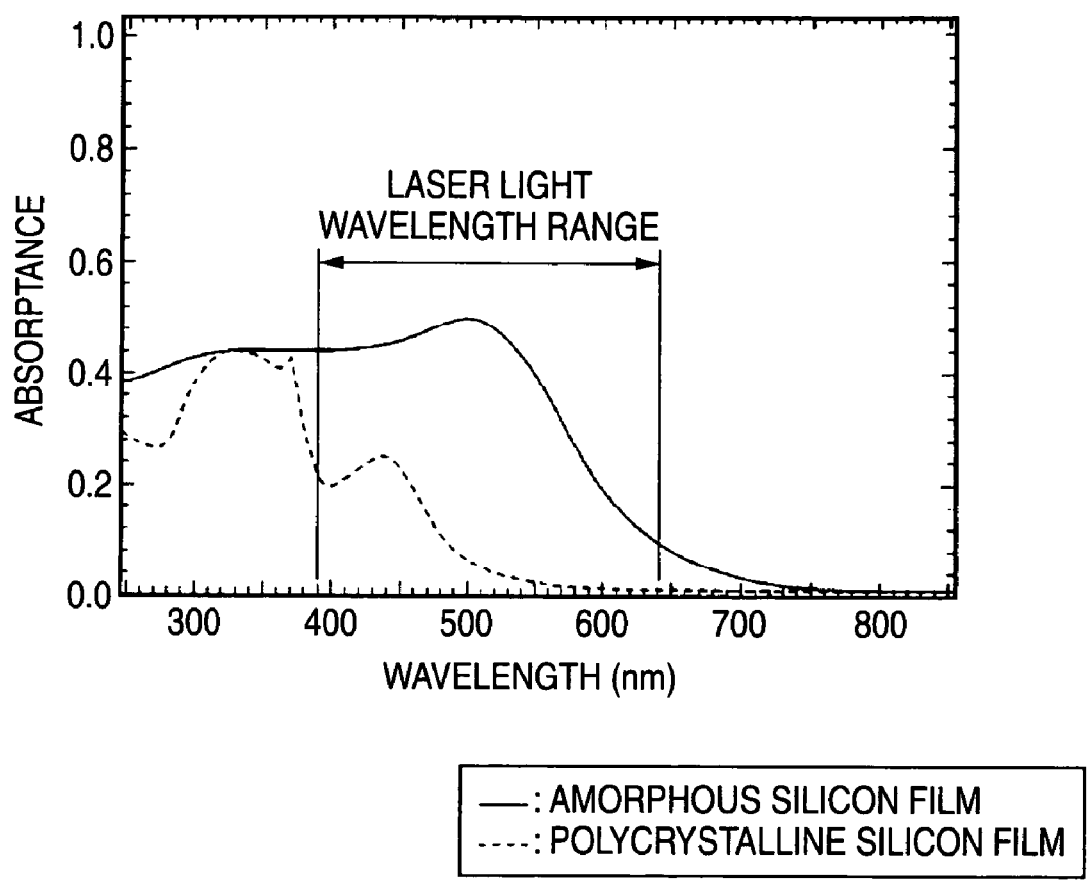
FIG. 20 is a graph to show the relation between an absorption coefficient of each of an amorphous silicon film and a polycrystalline silicon film and a wavelength of a laser beam.

As shown in FIG. 5, the polycrystalline silicon film 34 and the small crystal region 38 as prepared by one-time scanning with a laser beam are subjected to second scanning with a laser beam while deviating the position of the laser beam to be irradiated such that a part of the second laser irradiation area superposes the first scanning area. At this time, the small crystal area 38 is polycrystallized; in the polycrystalline silicon film, the light absorption coefficient is lowered in view of the relation between the wavelength and the absorption coefficient of a laser in amorphous silicon films and polycrystalline silicon film as shown in FIG. 20; and even when laser with the same energy density is irradiated, re-melting does not occur.

For that reason, in the small crystal area 38, melting does not occur by the second scanning with a laser beam, and small crystals remain, resulting in causing deterioration of characteristics. This causes deterioration in the mobility and S value of TFT as shown in FIG. 22, and this deterioration of characteristics results in a defect that the superposed part of the laser beam is recognized by human eyes. Furthermore, since the area where this deterioration of characteristics causes is very narrow as usually 36 μm, and 72 μm at most, it could not be detected in conventional TFTs for testing as disposed at intervals of 500 μm or 250 μm.

The invention has been made on the basis of the foregoing knowledge and is to improve characteristics in the foregoing superposed part and make it possible to recognize even a slight difference in characteristics in the superposition area on a panel.

Specific embodiments of the invention will be hereunder described.

EMBODIMENT 1

Figure 6A:
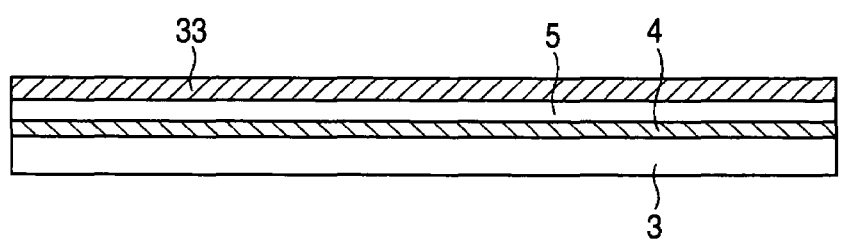
FIGS. 6A to 6C are a cross-sectional views of an individual method to show a method for producing TFT in Embodiment 1 of the invention.

FIGS. 6 to 8 are each a cross-sectional view of an individual method to show a method for producing TFT in Embodiment 1 of the invention. In FIG. 6A, 100 nm of a silicon nitride film (SiN film) 4, 100 nm of a silicon oxide film ($SiO_2$ film) 5, and 70 nm of an amorphous silicon film 33 were successively formed on a glass substrate 3 by a plasma CVD process. Corning 1737 manufactured by Corning Incorporated was used for the glass substrate 3. The SiN film 4 is formed for the purpose of preventing diffusion of impurities in the glass substrate into a semiconductor layer from occurring. However, it should not be construed that the invention is limited thereto. Materials such as SiON, SiC, AlN, and $Al_2O_3$ may be used. Furthermore, in this case, while a double-layered structure of the $SiO_2$ film 5 and the SiN film 4 was used as a prime film of the amorphous silicon film 33, it should not be construed that the invention is limited thereto. Such films may be omitted, or a more laminated structure may be employed. Next, the amorphous silicon film 33 was thermally treated in vacuum to remove unnecessary hydrogen.

Figure 6B:
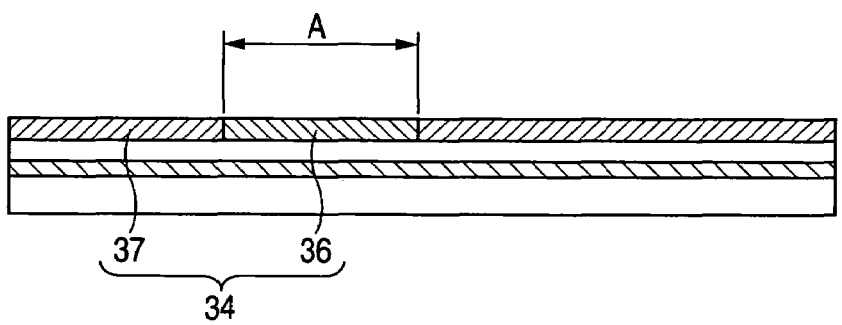

Next, as shown in FIG. 6B, a YAG2ω laser having a wavelength of 532 nm was irradiated on the amorphous silicon film 33 while adjusting a power density at 0.5 J/$cm^2$ on the amorphous silicon film 33, thereby polycrystallizing the amorphous silicon film 33 on the polycrystalline silicon film 34. The used laser beam has a length in the long side direction of 100 mm and a width in the short side direction of 40 μm. The laser beam had an oscillation frequency of 1 kHz, and the polycrystallization was carried out by moving the irradiation area of the laser beam by 3 μm in the short side direction at every one pulse.

After first scanning with a laser beam, second scanning with a laser beam was carried out by moving the glass substrate 3 such that 0.5 mm of the second laser irradiation area superposed the first laser irradiation area in the long side direction. By repeating this scanning, the amorphous silicon film 33 on the glass substrate 3 was formed into the polycrystalline silicon film 34. The polycrystalline silicon film 34 is composed of a laser irradiation part 37 and a laser superposition part 36. The resulting polycrystalline silicon film has a particle size of approximately 0.5 μm.

Figure 6C:
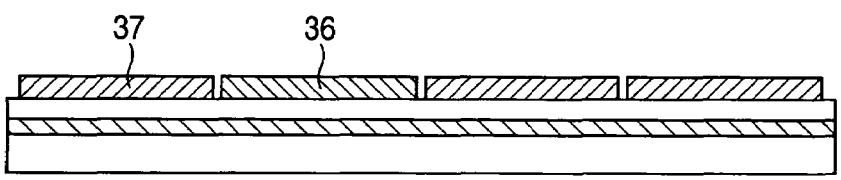

Next, as shown in FIG. 6C, a resist mask was formed by photolithography process and the polycrystalline silicon film 34 was dry etched, thereby forming an island of the polycrystalline silicon film 34. Thereafter, the resist was removed by ashing and chemical treatment. In FIG. 6C, the laser superposition part 36 becomes a single island of the polycrystalline silicon as it is. However, the invention is not always limited thereto so far as the superposed portion and the island position are not intentionally adjusted. There may be the case where a part of the island part of the polycrystalline silicon film is the laser superposition part 36 or the laser superposition part 36 does not exist in the island at all. In this embodiment, the explanation will be made assuming that the laser superposition part 36 becomes a single island as it is.

Figure 7A:
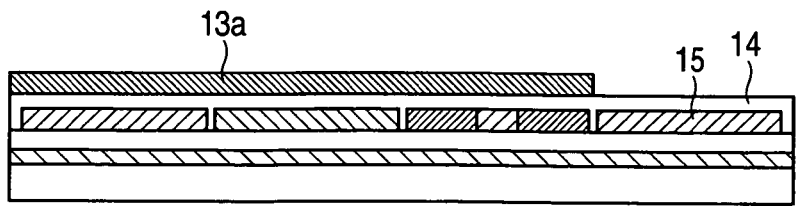
FIGS. 7A to 7C are cross-sectional views of an individual method to show a method for producing TFT in Embodiment 1 of the invention.

Next, as shown in FIG. 7A, 100 nm of an $SiO_2$ film was formed as a gate insulation film 14 by a plasma CVD process. TEOS and $O_2$ were used as raw materials for plasma CVD. Next, in order to control the threshold value, boron (B) was implanted into the island of polycrystalline Si by an ion doping process. This implantation was carried out over the entire surface without using a resist mask. An amount of injection is $10^{12}$ $cm^{-2}$, and accelerating energy is 60 keV. This process may be omitted as the need arises. Next, a resist 13a was formed by photolithography process, and $10^{15}$ $cm^{-2}$ of phosphorus (P) was implanted into the desired polycrystalline silicon film 34 at 70 keV, thereby forming a holding capacitance lower electrode 15. Thereafter, the resist 13a was removed by ashing and chemical treatment.

Figure 7B:
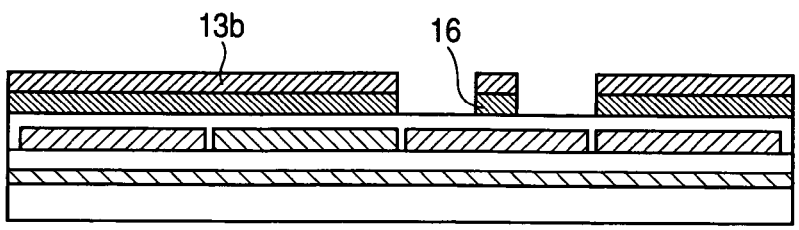

Next, as shown in FIG. 7B, 200 nm of chromium (Cr) was formed by a sputtering process; a resist 13b was formed in only a position where PMOS-TFT is to be formed by photolithography process; and a gate electrode 16 was formed by wet etching of Cr. At this time, in the resist 13b in an area where NMOS-TFT is to be formed, the entire surface of the area on which NMOS-TFT is to be formed is covered such that a pattern of the gate electrode 16 is not formed.

Figure 7C:
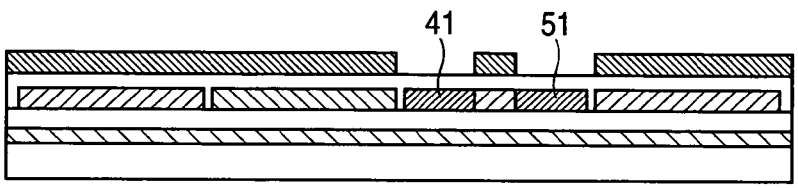

Next, as shown in FIG. 7C, $2\times10^{15}$ $cm^{-2}$ of boron (B) was implanted at accelerating energy of 40 keV. Thereafter, the resist 13b was removed by ashing and chemical treatment. By this process, a source area 41 and a drain area 51 of PMOS-TFT were formed. Since as shown in FIG. 7B, the area where NMOS-TFT is to be prepared is covered by the resist 13b, B is not injected thereinto.

Figure 8A:
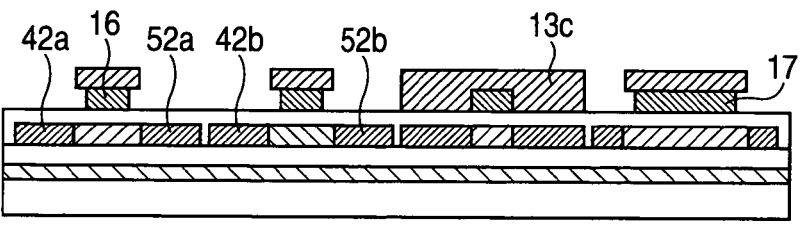
FIGS. 8A to 8C are cross-sectional views of an individual method to show a method for producing TFT in Embodiment 1 of the invention.

Next, as shown in FIG. 8A, a resist 13c is formed in an area where NMOS-TFT is to be formed and an area where a holding capacitance is to be formed by photolithography process. Thereafter, a gate electrode 16 and a holding capacitance upper electrode 17 in an NMOS-TFT area were formed by wet etching of Cr. In wet etching of the gate electrode 16, the etching time is adjusted such that over etching is carried out for Cr to incorporate side etching in Cr, thereby making a Cr pattern smaller than that in the resist 13c. Thereafter, $2\times10^{15}$ $cm^{-2}$ of phosphorus (P) was injected at accelerating energy of 60 keV before removing the resist 13c. By this process, source areas 42a, 42b and drain areas 52a, 52b of NMOS-TFT are formed.

Figure 8B:
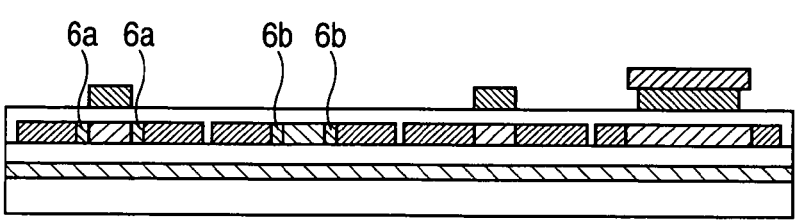
Figure 8C:
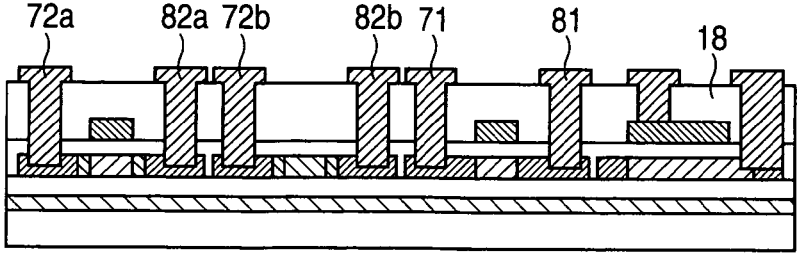

Next, as shown in FIG. 8B, after removing the resist 13c by ashing and chemical treatment, $1\times10^{13}$ $cm^{-2}$ of P was implanted at accelerating energy of 70 keV. By this process, LLD (lightly-doped drain) areas 6a, 6b of NMOS-TFT are formed in a place closed to the gate electrode 16 as compared with the source areas 42a, 42b and the drain areas 52a, 52b. Incidentally, display of the LDD areas is omitted in a holding capacitance part.

Next, 400 nm of an $SiO_2$ film was formed by a plasma CVD process, thereby forming an interlayer insulation film 18. A resist mask was formed by photolithography process (not shown), and the interlayer insulation film 18 and the gate insulation film 14 were dry etched to form a contact hole. In addition, a laminated film of Cr and Al was formed, and source electrodes 71, 72a, 72b and drain electrodes 81, 82a, 82b were formed by photolithography process and wet etching. Actually, in a pixel transistor which is formed in the display part at this time, a pixel electrode is also formed at the same time. In the light of the above, a holding capacitance, NMOS-TFT and PMOS-TFT were formed. In Embodiment 1, the transistor to be prepared in an area where the laser beam scanning is superposed is NMOS-TFT and is a transistor having the source electrode 72b and the drain electrode 82b in FIG. 8C. There may be the case where PMOS-TFT is formed or a holding capacitance is formed in the superposed part depending upon the position of the superposed part of a laser beam. All of these cases are free from a problem that the characteristics are deteriorated. Usually, the holding capacitance and the NMOS-TFT are used in a pixel part (display part), and the NMOS-TFT and the PMOS-TFT are used in a peripheral circuit such as a driver circuit.

Figure 9:
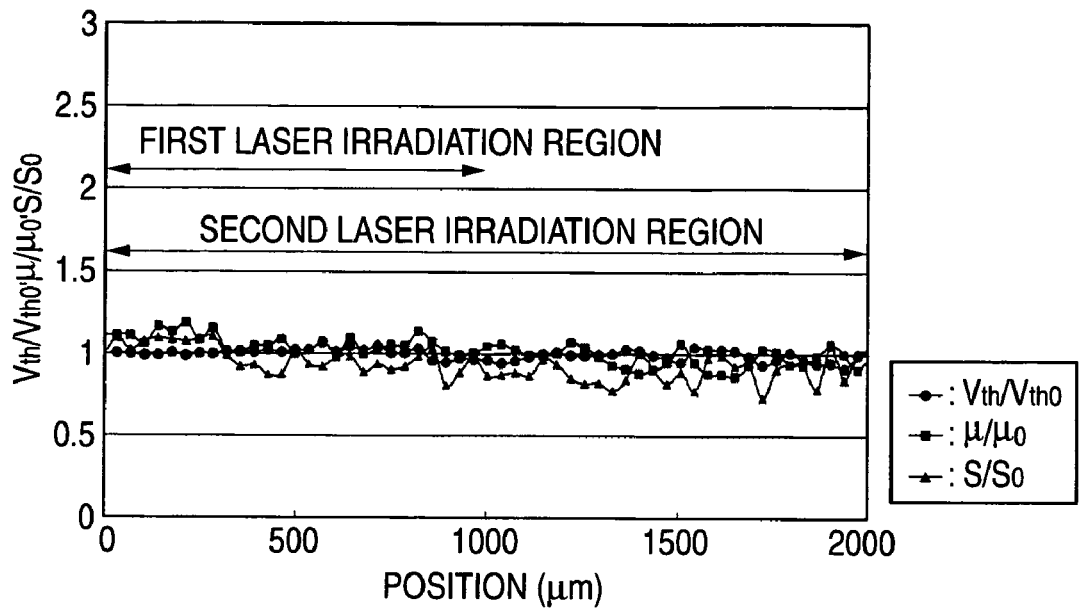
FIG. 9 is a graph to show the distribution of relative value of carrier mobility, $V_{th}$ and S value of NMOS-TFT in Embodiment 1 of the invention.
Figure 10:
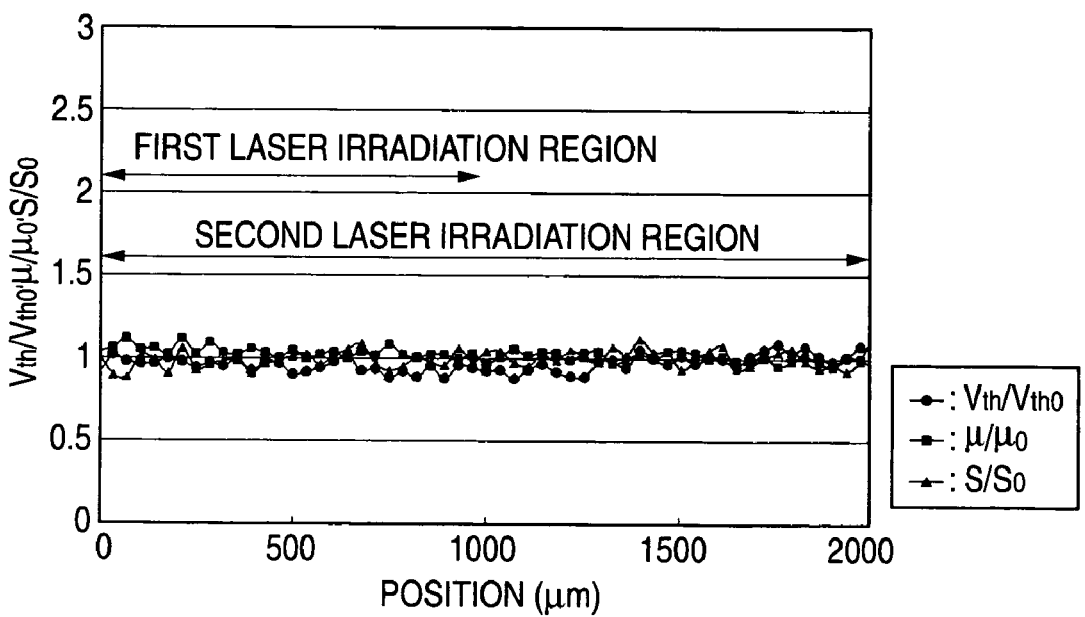
FIG. 10 is a graph to show the distribution of relative value of carrier mobility, $V_{th}$ and S value of PMOS-TFT in Embodiment 1 of the invention.

Electrical characteristics of the transistor as prepared in the foregoing production process were evaluated at intervals of 36 μm. FIG. 9 shows the position dependency of the mobility, $V_{th}$ and S value of NMOS-TFT as prepared according to Embodiment 1. Furthermore, FIG. 10 similarly shows the position dependency of the mobility, $V_{th}$ and S value of PMOS-TFT. It is understood that in all of NMOS-TFT and PMOS-TFT, a decrease in the mobility and an increase in the S value do not occur, whereby transistors having satisfactory characteristics are obtained. That is, it is exhibited that crystallinity of the silicon film in the end part of laser beam and the area where the scanning is superposed is satisfactory.

This is because the silicon film has a thick thickness as 70 nm so that it thoroughly absorbs a laser beam having a wavelength of 532 nm; and therefore, small crystals within the irradiation area and small crystals outside the irradiation area as generated by the first laser beam scanning are completely molten by the second laser beam scanning as superposed and irradiated, whereby polycrystalline silicon having a thoroughly large size is formed.

Figure 11:
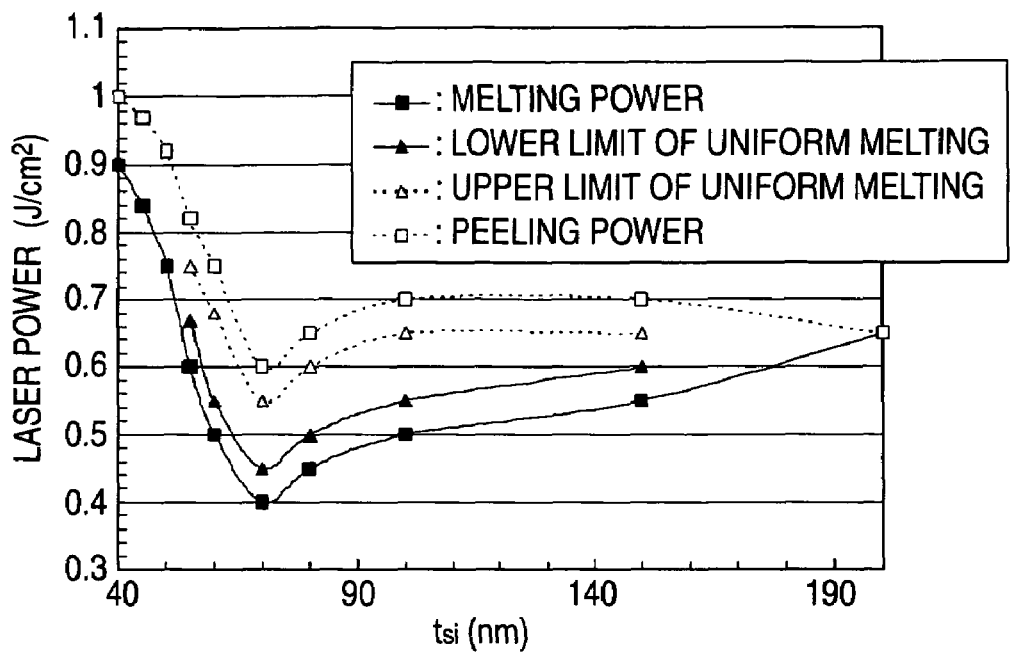
FIG. 11 is a graph to show the relation between a thickness of an amorphous silicon film and a power density of laser beam having a wavelength of 532 nm in Embodiment 1 of the invention.

FIG. 11 is a graph to show the power density of a YAG2ω laser having a wavelength of 532 nm and the crystal state of a silicon film of every kind. 100 nm of a silicon nitride film (SiN film) and 100 nm of a silicon oxide film ($SiO_2$ film) were formed on a glass substrate. Thereafter, an amorphous silicon film was formed in a thickness ranging from 40 nm to 200 nm by a plasma CVD process. Next, the amorphous silicon film was thermally treated in vacuum to remove unnecessary hydrogen.

Next, a YAG2ω laser having a wavelength of 532 nm was irradiated on the amorphous silicon film while changing the power density, thereby polycrystallizing the amorphous silicon film into a polycrystalline silicon film. This laser irradiation was carried out by superposing twice. The crystal state of this polycrystalline silicon film was observed by visualizing the grain boundary by Secco etching (etching with a mixed solution of a potassium bichromate solution and hydrofluoric acid).

FIG. 11 shows the crystal state of a polycrystallized silicon film with a varied thickness. The term "melting power" as referred to in FIG. 11 means a minimum power density at which the amorphous silicon film is molten. That is, the amorphous silicon film is not molten at a power density less than the melting power. When the laser power to be irradiated is increased, the temperature of the molten silicon film raises. When the power density exceeds a certain level, a surface tension is lowered and therefore, there is generated a phenomenon in which the molten silicon film becomes partially thin. In this case, the silicon film is coagulated and solidified so that an area where a silicon film does not exist at places of the substrate becomes present. A power density at which an area where a silicon film does not exist becomes present is called "peeling power". That is, when the laser power density exceeds this peeling power, a homogenous polycrystalline silicon film is not obtained.

Though a polycrystalline silicon film which is free from coagulation and peeling regarding the ranges of the melting power and peeling power is obtained, the resulting crystal is not always uniform in size. FIG. 11 shows the laser power density at which a crystal having a uniform size against the thickness of the silicon film of every kind is obtained. The term "lower limit of uniform melting" as referred to in FIG. 11 is a minimum value of the laser power density at which a crystal having a uniform size is obtained. When the laser power density is less than this laser power density, the crystal size of silicon in an area where a laser beam having a small power density caused due to scattering of the power density of laser beam is irradiated does not become large so that the resulting crystal becomes small.

The term "upper limit of uniform melting" as referred to in FIG. 11 is a maximum value of the laser power density at which a crystal having a uniform size is obtained. When the laser power density exceeds this power density, a small crystal of silicon is generated in an area where a laser beam having a large power density caused due to scattering of the power density of laser beam is irradiated. This is because the temperature of molten silicon in an area where the power density is large is high so that the molten silicon is longer in melting time than circumferential molten silicon and is ultimately solidified. For that reason, the crystal growth is hindered by already solidified crystals in the vicinity thereof so that a small crystal is generated. Accordingly, a crystal having a uniform size is obtained within the range of the power density from the lower limit of uniform melting to the upper limit of uniform melting is obtained. When the power density falls outside this range, a polycrystalline silicon film is not obtained, or the resulting silicon film becomes a silicon film containing small crystals. Even when TFT is prepared on a silicon film containing small crystals, TFT having satisfactory electrical characteristics is not obtained.

It is noted from FIG. 11 that when the thickness of the amorphous silicon film falls within the range of from 55 nm to 150 nm, a uniform crystal is obtained. Accordingly, in TFT as prepared by using an amorphous silicon film having a thickness falling within this range, satisfactory electrical characteristics are obtained even in a portion where a laser beam is superposed.

Incidentally, in the case where a laser beam having a wavelength of 532 nm is irradiated, the power density necessary for melting the amorphous silicon film becomes a minimum when the thickness of the amorphous silicon film is 70 nm. This is because since the laser beam having a wavelength of 532 nm has a penetration length of 1,000 nm, when the thickness of the amorphous silicon film is thin, almost all of laser beams pass through the silicon film so that they do not contribute to a temperature rise of the silicon film and therefore, a high power density is required for melting. Furthermore, when the thickness of the silicon film exceeds 70 nm, since thermal diffusion in the width direction of silicon becomes large at the time of irradiating a laser beam, the power density necessary for melting increases.

Figure 12:
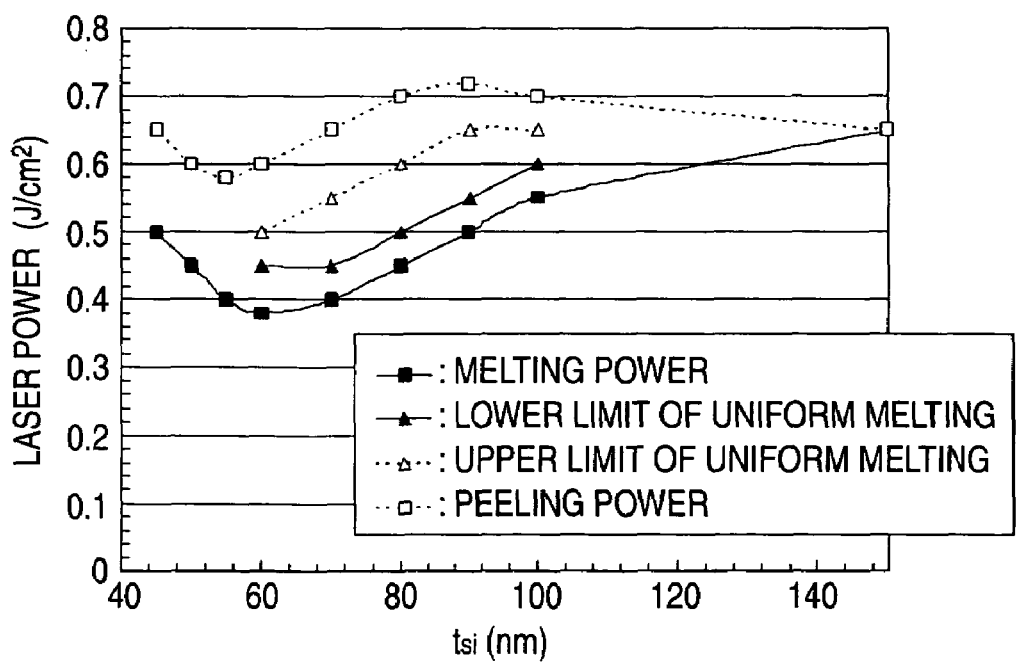
FIG. 12 is a graph to show the relation between a thickness of an amorphous silicon film and a power density of laser beam having a wavelength of 390 nm in Embodiment 1 of the invention.

FIG. 12 is a graph to show the power density of a Ti:sapphire 2ω laser having a wavelength of 390 nm and the crystal state of a silicon film of every kind. 100 nm of a silicon nitride film (SiN film) and 100 nm of a silicon oxide film ($SiO_2$ film) were formed on a glass substrate. Thereafter, an amorphous silicon film was formed in a thickness ranging from 45 nm to 150 nm by a plasma CVD process. Next, the amorphous silicon film was thermally treated in vacuum to remove unnecessary hydrogen.

Next, a Ti:sapphire 2ω laser having a wavelength of 390 nm was irradiated on the amorphous silicon film while changing the power density, thereby polycrystallizing the amorphous silicon film into a polycrystalline silicon film. This laser irradiation was carried out by superposing twice. The crystal state of this polycrystalline silicon film was observed by visualizing the grain boundary by Secco etching.

FIG. 12 shows the relation between the crystal state of a polycrystallized silicon film with a varied thickness and the power, density. The definitions of the melting power, the peeling power, the lower limit of uniform melting and the upper limit of uniform melting are the same as in Embodiment 1. It is noted from FIG. 12 that when the thickness of the amorphous silicon film falls within the range of from 60 nm to 100 nm, a uniform crystal is obtained. Accordingly, in the case of irradiating a laser beam having a wavelength of 390 nm, in TFT as prepared by using an amorphous silicon film having a thickness falling within this range, satisfactory electrical characteristics are obtained even in a portion where a laser beam is superposed.

Incidentally, though in this embodiment, the Ti:sapphire 2ω laser was used as the laser, Dye laser may be employed.

Figure 13:
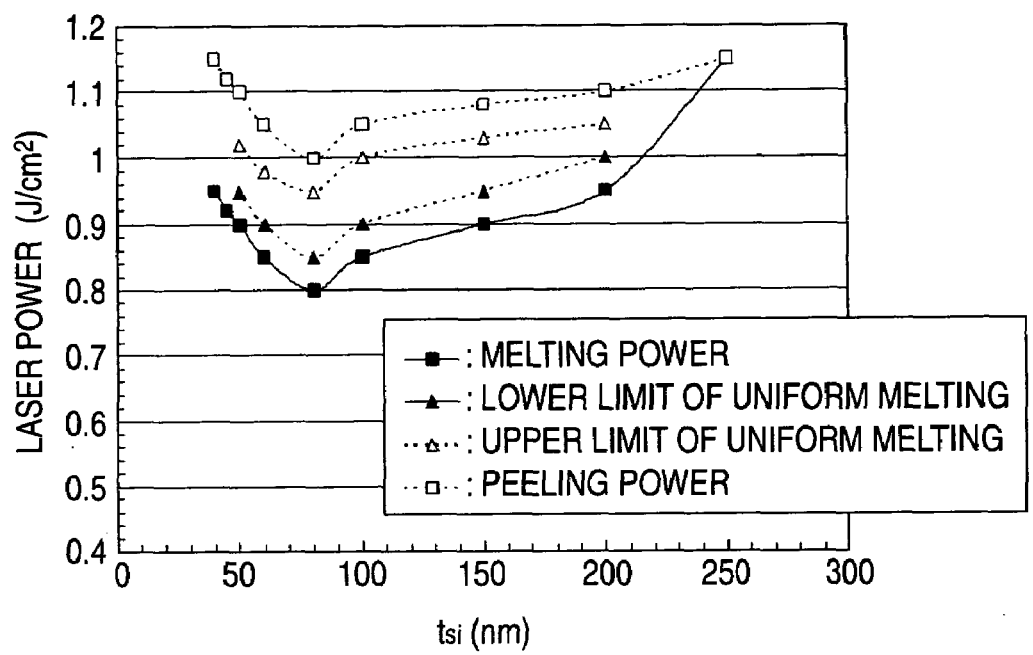
FIG. 13 is a graph to show the relation between a thickness of an amorphous silicon film and a power density of laser beam having a wavelength of 640 nm in Embodiment 1 of the invention.

FIG. 13 is a graph to show the power density of a Ti:sapphire laser having a wavelength of 640 nm and the crystal state of a silicon film of every kind. 100 nm of a silicon nitride film (SiN film) and 100 nm of a silicon oxide film ($SiO_2$ film) were formed on a glass substrate. Thereafter, an amorphous silicon film was formed in a thickness ranging from 40 nm to 250 nm by a plasma CVD process. Next, the amorphous silicon film was thermally treated in vacuum to remove unnecessary hydrogen.

Next, a Ti:sapphire laser having a wavelength of 640 nm was irradiated on the amorphous silicon film while changing the power density, thereby polycrystallizing the amorphous silicon film into a polycrystalline silicon film. Here, a basic wave of a Ti:sapphire laser was used. This laser irradiation was carried out by superposing twice. The crystal state of this polycrystalline silicon film was observed by visualizing the grain boundary by Secco etching.

FIG. 13 shows the relation between the crystal state of a polycrystallized silicon film with a varied thickness and the power density. The definitions of the melting power, the peeling power, the lower limit of uniform melting and the upper limit of uniform melting are the same as in Embodiment 1. It is noted from FIG. 13 that when the thickness of the amorphous silicon film falls within the range of from 50 nm to 200 nm, a uniform crystal is obtained. Accordingly, in the case of irradiating a laser beam having a wavelength of 640 nm, in TFT as prepared by using an amorphous silicon film having a thickness falling within this range, satisfactory electrical characteristics are obtained even in a portion where a laser beam is superposed.

Figure 14:
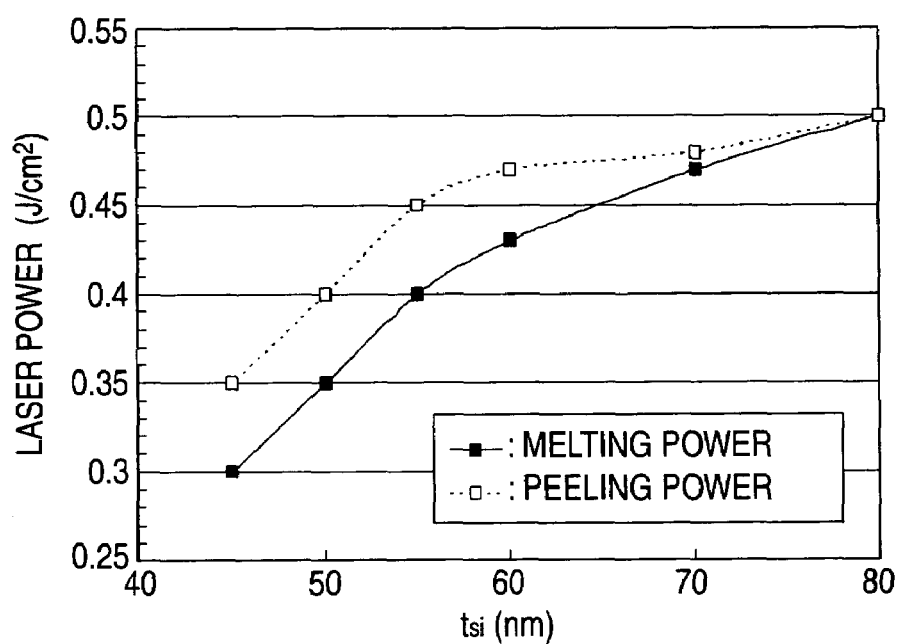
FIG. 14 is a graph to show the relation between a thickness of an amorphous silicon film and a power density laser beam having a wavelength of 308 nm.

Incidentally, the same experiment was carried out by using an excimer laser having a wavelength of 308 nm. FIG. 14 shows the relation between the crystal state of a polycrystallized silicon film with a varied thickness and the power density of an excimer laser.

An amorphous silicon film was formed in a thickness ranging from 45 nm to 80 nm by a plasma CVD process. Other conditions for forming a film are the same as described above. As is clear from FIG. 14, in the irradiation with an excimer laser, though the amorphous silicon film having a thickness in the range of from 45 nm to 70 nm was molten, a polycrystalline silicon film having a uniform size which is free from the generation of a small crystal was not obtained at any thickness.

Figure 15:
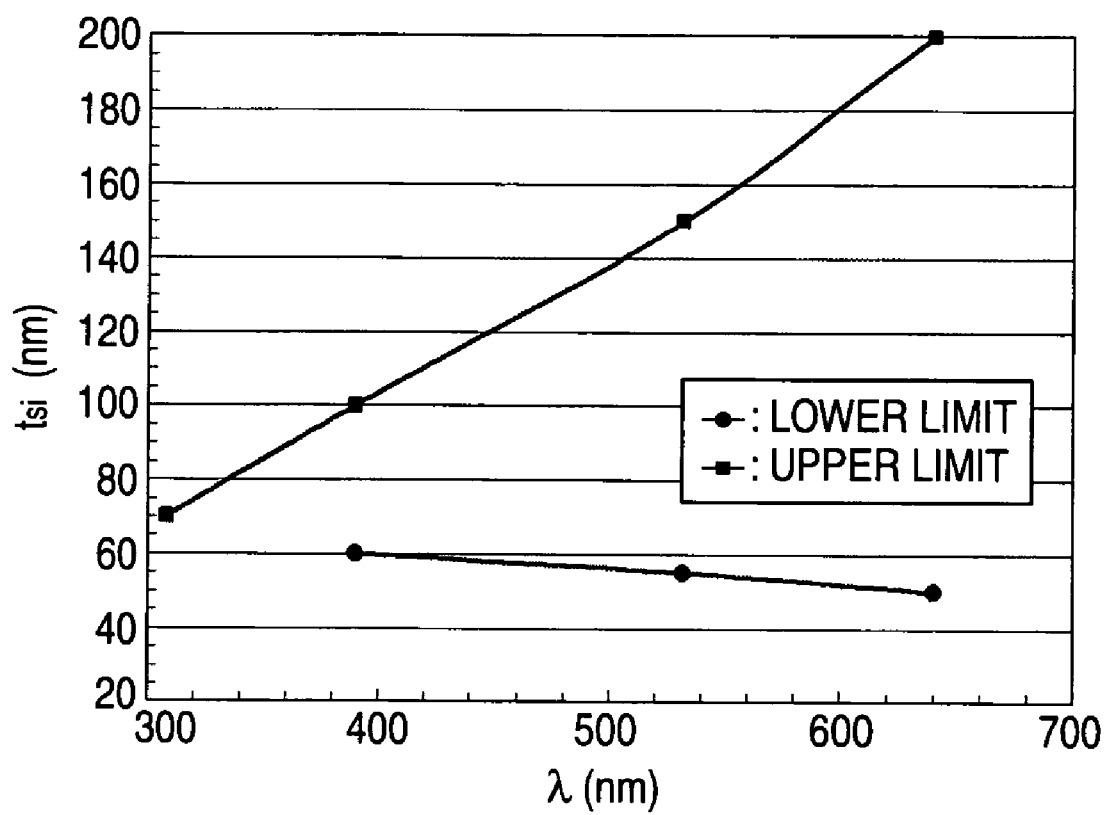
FIG. 15 is a graph to show the relation between a wavelength of laser beam and a thickness of a silicon film in Embodiment 1 of the invention.

FIG. 15 shoes the experimental results by irradiation with a laser having a wavelength of every kind. FIG. 15 is a graph to show the relation between the wavelength of a laser beam and the thickness of a silicon film from which satisfactory results are obtained. In FIG. 15, the lower limit shows a minimum thickness of a silicon film at which characteristics of TFT are not deteriorated in a superposed portion of laser beam scanning and its circumferences. When the wavelength of a laser beam is short, the penetration length into the silicon film is reduced. Thus, the thickness of the silicon film necessary for melting finely crystalline silicon increases. It was experimentally confirmed that the penetration length of light having a wavelength of, for example, 390 nm is 147 nm; and that when the thickness of the silicon film is 60 nm or more, the finely crystalline silicon is completely molten, is whereby the surroundings and characteristics are not deteriorated. However, in the case of a laser beam having a wavelength of 308 nm, a satisfactory crystal was not obtained in a superposed portion.

Furthermore, the upper limit value as shown in FIG. 15 shows a maximum thickness of a silicon film at which a satisfactory crystal is obtained. This upper limit thickness is 100 nm in the case of a laser beam having a wavelength of 390 nm, increases with an increase of the wavelength and becomes 200 nm at a wavelength of laser beam of 640 nm. When the wavelength becomes long, since the penetration length of light into the silicon film increases, a satisfactory crystal is obtained even in the case of a thicker silicon film. However, in the case of exceeding this upper limit value, even when the silicon film is molten and crystallized on the surface thereof, sufficient crystallization is not achieved in the lower part of the silicon film. In the light of the above, a satisfactory crystal is obtained in a superposed portion of laser beam scanning in a thickness of the silicon film in the range of from 60 to 100 nm by a laser beam having a wavelength of from 390 to 640 nm.

Furthermore, in Embodiment 1 of the invention, the superposed portion of laser scanning (A of FIG. 6B) was set up at 0.5 mm. As described previously, a fine crystal area within the laser irradiation area due to the interference of a laser beam is generated in the inside of 200 μm from the end part of the laser beam. Accordingly, in order to obtain a polycrystalline silicon film having a sufficient size by completely melting this fine crystal area by the second laser beam scanning, it is necessary to set up the superposed portion between the first laser beam scanning and the second laser beam scanning at 0.2 mm or more at a minimum, and preferably 0.3 mm or more. Since an area where a small crystal is generated is very narrow as approximately 36 μm, when the laser beam scanning area is superposed by 0.2 mm, the small crystal area disappears. Incidentally, as is clear from the basic principle of the invention, there is no upper limit regarding the width of the superposed portion of the laser beam scanning area. However, what the width of the superposed portion is increased is not preferable because more laser beam scanning is required for the purpose of forming polycrystalline silicon on a glass substrate having a large area, thereby increasing the manufacturing costs. The width of the superposed portion is determined by taking into consideration the size of the glass substrate and the length of the laser beam in the long side direction. Usually, by taking into consideration the mass productivity, it is desired to set up the long side direction of the laser beam and so on such that the width of the superposed portion falls within 2 mm.

EMBODIMENT 2

In FIGS. 6A to 6C, a surface roughness of the laser superposition part 36 is larger than that of the laser irradiation part 37 as formed in a portion where scanning is not superposed. This average surface roughness was measured by a laser interference type three-dimensional surface topographic analyzer (NT3300 manufactured by Veeco Instruments, vertical resolution: 0.1 nm). As a result, it was Ra=8 nm in the laser superposition part 36 and Ra=6 nm in the laser irradiation part 37, respectively. The reasons why the surface roughness of the laser superposition part 36 where the laser beam scanning is superposed becomes large will be hereunder described with reference to FIGS. 16A to 16C. Since a laser beam having a width of 40 μm in the short side direction is irradiated while deviating by every 3 μm step, amorphous silicon at a certain one point (it becomes polycrystalline silicon after the second pulse irradiation) receives irradiation with a laser beam 13 times.

Figure 16A:
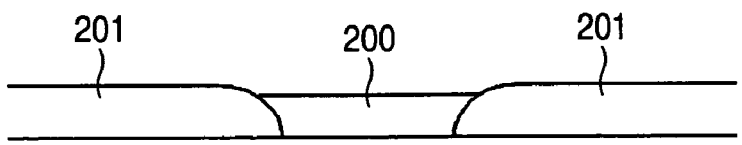
FIGS. 16A to 16D are drawings to show forming processes of a surface shape of a silicon film in Embodiment 2 of the invention.

The amorphous silicon which has received the laser irradiation is molten to form liquid silicon 200. The liquid silicon 200 is cooled, and a part thereof is solidified as shown in FIG. 16A. Namely, solid silicon 201 in an island form is present in the molten area. On this occasion, since the density of the liquid silicon 200 is larger than that of the solid silicon 201, the volume of the solid silicon 201 increases as compared with that of the liquid silicon 200, whereby the solid silicon 201 is solidified while pressing the liquid silicon 200.

Figure 16B:
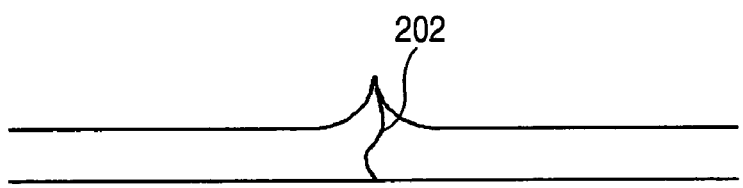

Since a large number of the solid silicon 201 in an island form is present and the liquid silicon 200 which is ultimately solidified is pressed by the solid silicon 201 from the both sides thereof, the liquid silicon 200 is swollen from the circumferences and solidified as shown in FIG. 16B. Since the ultimately solidified area is an area where the crystal is grown (solidified) from the both sides, a grain boundary 202 is formed in this area. The melting and solidification is carried out 13 times in total.

Figure 16C:
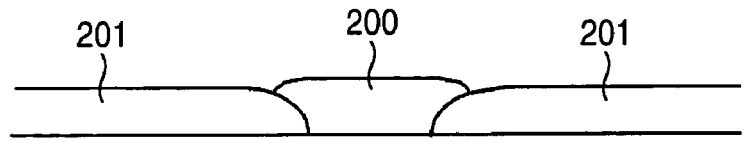
Figure 16D:
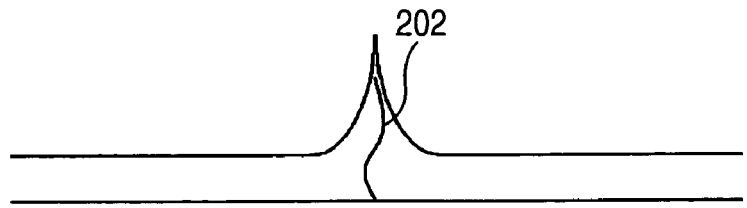

An absorption coefficient of a YAG2ω laser having a wavelength of 532 nm to crystallized silicon is $10^4$ cm$^{-1}$. That is, a penetration length at which the laser beam intensity becomes 1/e (e represents the base of natural logarithms) is 1,000 nm (1 μm). On the other hand, the thickness of the silicon film is from 60 nm to 100 nm from Embodiment 1. In such a silicon film, since the film thickness is sufficiently thinner than the penetration length, the thick one more absorbs the laser beam, whereby the temperature more increases. For that reason, when a surface roughness is once formed, a temperature difference between a thick part of the film (convex) and a thin part of the film (concave) increases at the time of next laser pulse irradiation as compared with that at the time of preceding laser pulse irradiation, whereby further swelling occurs during the solidification as seen in FIGS. 16C and 16D. In this way, when the penetration length into the silicon is very long as compared with the film thickness, the surface roughness of the crystallized silicon film increases with an increase the number of laser irradiation.

On the other hand, in an excimer laser having a wavelength of 308 nm, an absorption coefficient of the crystal silicon is $10^6$ cm$^{-1}$, and a penetration length is merely 10 nm. For that reason, in the excimer laser irradiation, even when a surface roughness is formed, the laser beam is absorbed only on the surface of the silicon film. Thus, the temperature in the convex does not increase as compared with the temperature in the concave and therefore, even when the number of laser pulse irradiation increases, the surface roughness does not increase.

Now, in the superposed portion of laser beam scanning, the number of laser pulse to be irradiated becomes twice that in a portion where the laser beam scanning is not superposed. Thus, the surface roughness of the laser superposition part 36 becomes large. As a result, in the invention, when a laser beam having a wavelength of from 390 to 640 nm is used and the thickness of the silicon film is regulated at from 60 nm to 100 nm, a silicon film in which the surface roughness in a superposed portion of laser beam scanning is larger than that in a portion where the laser beam scanning is not superposed is obtained.

Figure 17:
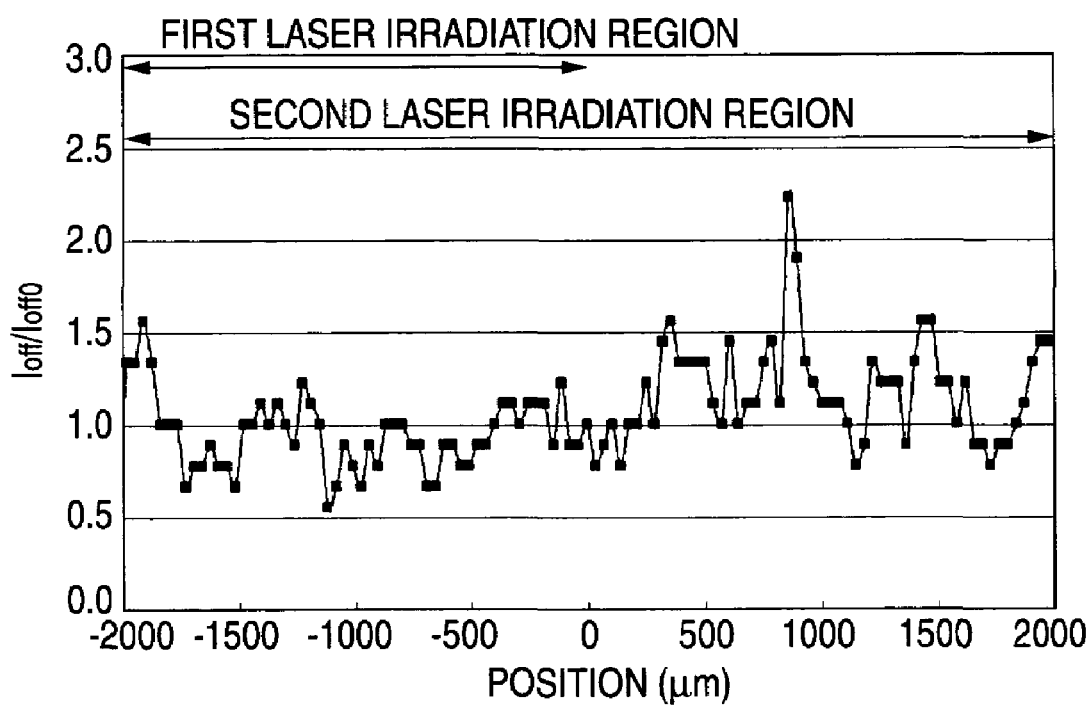
FIG. 17 is a graph to show the distribution of a leak current of NMOS-TFT in Embodiment 2 of the invention.

NMOS-TFT was prepared on silicon having an increased surface irregularity in this way, and a leak current was measured. The obtained results are shown in FIG. 17. In FIG. 17, an area of from −2,000 to 0 μm is a portion where a laser is superposed and irradiated and is a portion having a large surface irregularity; and an area of from 0 to 2,000 μm is a portion having small surface roughness.

It is understood from these results that the leak current in the portion having a large surface roughness is low.

This mechanism will be hereunder described.

As described previously, the grain boundary is present in a protruded part. This is because a point at which the silicon is ultimately solidified becomes the protruded part. In an area where laser scanning is superposed, namely a place where the surface roughness increases, a height of the protruded part is high so that the area of the grain boundary increases.

This grain boundary works as a site for trapping impurities (for example, Fe, Cr, and Ni) which produce levels in an energy band of silicon. This is a so-called "gettering effect" in semiconductors.

Accordingly, in an area where laser scanning is superposed, namely a place where the surface roughness increases, since the area of the grain boundary is large, the gettering effect of impurities becomes large. For that reason, it is possible to reduce the density of impurities in the silicon crystal.

For these reasons, in an area where laser scanning is superposed, namely a place where the surface roughness increases, the leak current ($I_{off}$) of TFT as prepared on this silicon film is reduced.

In other words, by increasing the surface roughness, it is possible to obtain TFT with a low leak current.

EMBODIMENT 3

Figure 18:
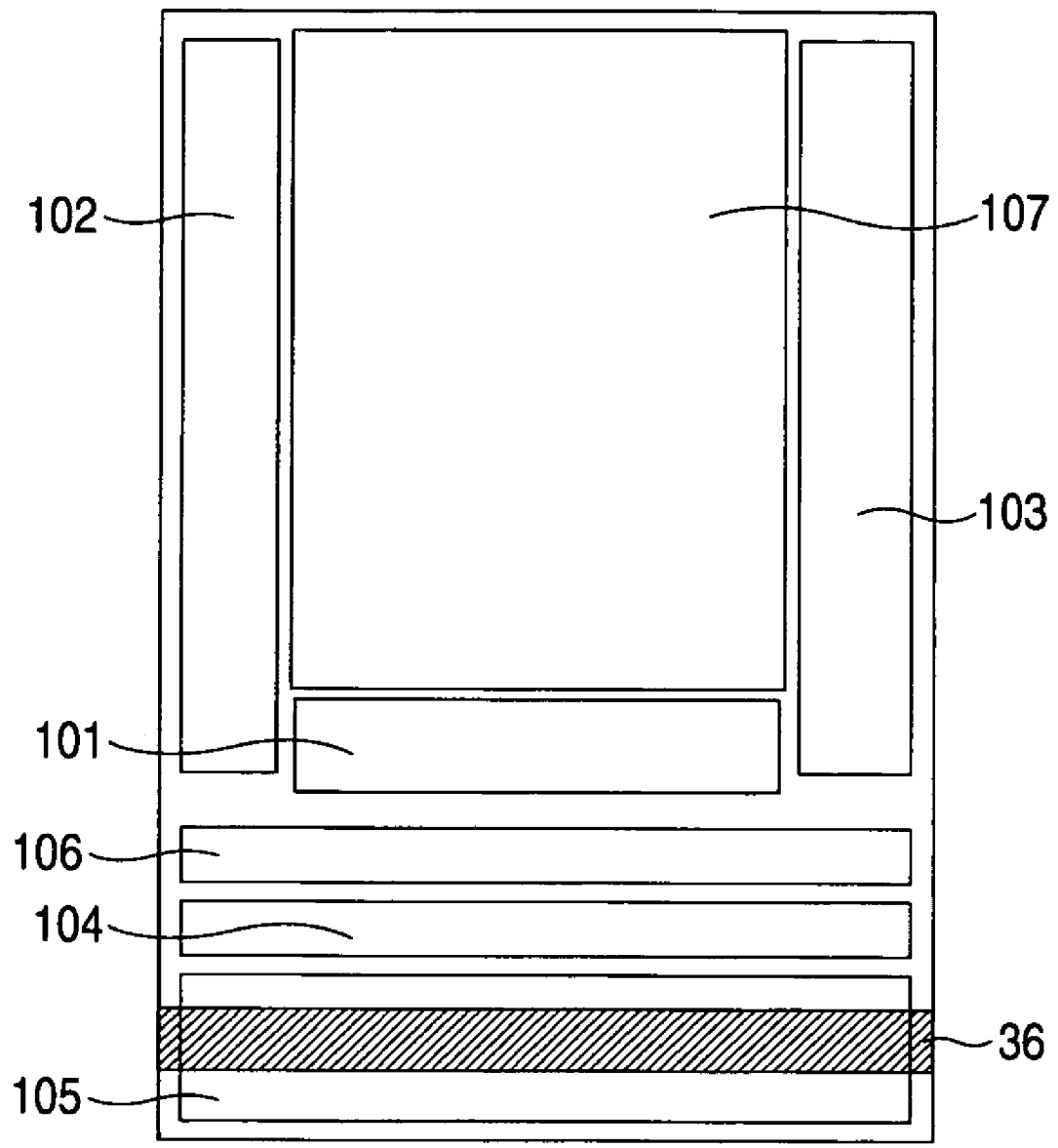
FIG. 18 is a drawing to show a liquid crystal display device in Embodiment 3 of the invention.

In Embodiment 1, TFT was prepared in all of the silicon film in a superposed portion of laser beam scanning and the silicon film in a portion where the laser beam scanning is not superposed, and the NMOS transistors were all driven at the same voltage of power source and the PMOS transistors were all driven at the same voltage of power source. However, in recent years, display devices using a different voltage of power source have been produced. This is because not only a gate driver circuit and a source driver circuit but also circuits for driving display devices such as a signal control circuit, a counter electrode driving circuit, a gradation voltage circuit, and a power source booster circuit have been all prepared by TFT on a glass substrate. In this way, in the case of a liquid crystal display device mounted with all circuits, it is necessary to drive TFT transistors at a different voltage of source power depending upon the circuit. In a liquid crystal display device as shown in FIG. 18, for example, it is necessary to drive a signal control circuit 105 at 3 V, a counter electrode driving circuit 103, a gradation voltage circuit 106, a gate driver 102 and a source driver 101 at 5 V, and a power source booster circuit 104 at 7 V, respectively. Though a liquid crystal display part 107 is usually driven at 5 V, in the case of reproducing motion videos and the like, there may be the case where 7 V is applied for the purpose of driving a liquid crystal at high speed. In this case, 7 V is applied to the source driver 101, too.

Figure 19:
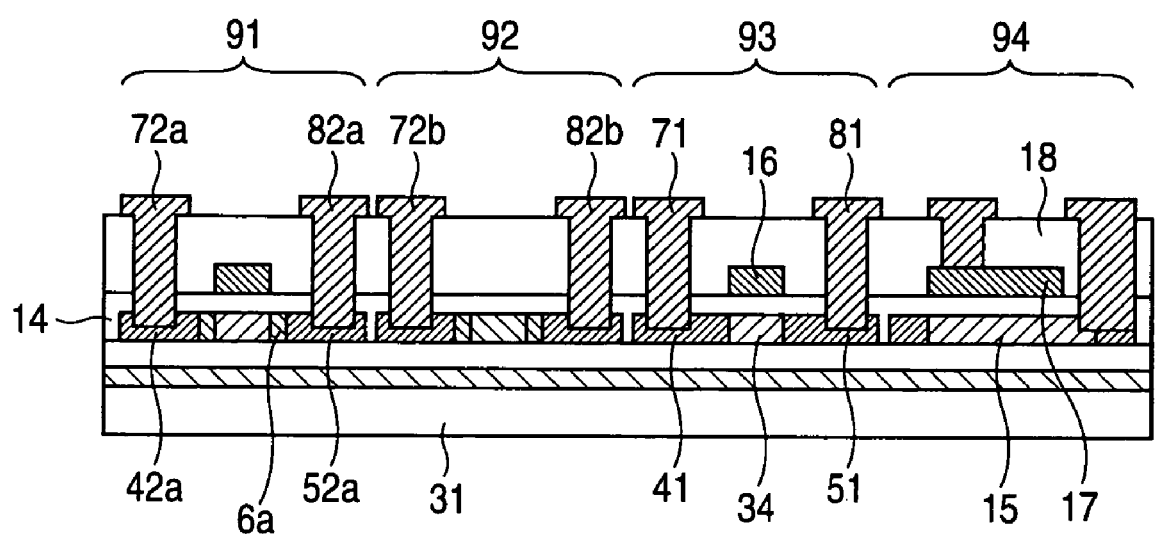
FIG. 19 is a drawing to show a cross-sectional structure of TFT in Embodiment 3 of the invention.

Now, as described previously, in the laser superposition part 36, the surface roughness of the silicon film increases. For that reason, breakdown voltage of the gate insulation film is slightly lowered. In order to improve reliability of the display device, the laser superposition part 36 was set up in a place where the signal control circuit 105 having a low power source voltage. FIG. 19 is a drawing to show TFT as prepared by the production method described in Embodiment 1. In FIG. 19, a transistor A 91, a transistor B 92, a transistor C 93 and a holding capacitance 94 are illustrated. Among them, the transistor B 92 is prepared in the laser superposition part 36 of laser beam scanning. This transistor B 92 is used in the signal control circuit 105 having a low power source voltage.

Since it is set up such that TFT having a low power source voltage is prepared in the superposed portion of laser beam scanning in this way, it is possible to avoid a problem that a high voltage is not applied to TFT as prepared on the silicon film having a large surface irregularity and the gate insulation film is deteriorated, whereby TFT does not act.

In the present embodiments, though the YAG2ω laser was used for the crystallization, it should not be construed that the invention is limited. A laser having a wavelength in the range of from 390 nm to 640 nm, such as a second harmonic of Nd:YVO$_4$ laser, a second harmonic of Nd:YLF laser, a second harmonic of Nd:glass laser, a second harmonic of Yb:YAG laser, a second harmonic of Yb:glass laser, an Ar ion laser, and a second harmonic of Ti:sapphire laser, may be employed.

Furthermore, in the foregoing embodiments, though examples of preparing a liquid crystal display device are given, it should not be construed that the invention is limited thereto. Needless to say, OLED (organic light emitting diode) may be used.

While the embodiments of the invention have been described above, the foregoing disclosed embodiments of the invention are merely exemplified to the end, and the scope of the invention is not limited to these embodiments of the invention. The scope of the invention is shown by the scope of the claims and includes all modifications in the equivalent meanings and within the scope of the claims.

What is claimed is:

1. A method for producing a semiconductor device, comprising:
    irradiating an amorphous semiconductor film on an insulating material and having a thickness in a range from 60 nm to 100 nm, with a pulsed laser beam having a wavelength in a range from 390 nm to 640 nm and a rectangular irradiation area, while scanning in a direction intersecting a longitudinal direction of the irradiation area, thereby forming a first polycrystalline semiconductor film; and
    irradiating a part of the amorphous semiconductor film with the laser beam while scanning in a longitudinal direction, intersecting the irradiation area, the part being partially superposed on the first polycrystalline semiconductor film and being partially adjacent to the first polycrystalline semiconductor film, thereby forming a second polycrystalline semiconductor film, the second polycrystallline semiconductor film having a larger surface roughness than parts of the first polycrystalline semiconductor film on which the second polycrystalline semiconductor film is not superposed.

2. The method for producing a semiconductor device according to claim 1, wherein an area where the first polycrystalline semiconductor film and the second polycrystalline semiconductor film are superposed has a width intersecting the scanning direction in a range from 0.2 mm to 2 mm.

3. The method for producing a semiconductor device according to claim 1, wherein the amorphous semiconductor film includes silicon.

4. The method for producing a semiconductor device according to claim 1, wherein the insulating material is a glass substrate or a quartz substrate.

5. The method for producing a semiconductor device according to claim 1, wherein the laser beam is one of a second harmonic of light produced by a Nd:YAG laser, a second harmonic of light produced by a Nd:YVO$_4$ laser, a second harmonic of light produced by a Nd:YLF laser, second harmonic of light produced by a Nd:glass laser, a second harmonic of light produced by a Yb:YAG laser, a second harmonic of light produced by a Yb:glass laser, light produced by an Ar ion laser, a second harmonic of light produced by a Ti:sapphire laser, and light produced by a dye laser.

6. A method for producing a semiconductor device, comprising:
    forming a first polycrystalline semiconductor film in a first irradiation area by irradiating an amorphous semiconductor film on an insulating material and having a thickness in a range from 55 nm to 150 nm, with a pulsed laser beam having a wavelength of 532 nm and a cross section in an elongated shape, while scanning the laser beam in a direction intersecting a longitudinal direction of the elongated cross section; and
    forming a second polycrystalline semiconductor film in a second irradiation area by irradiating a part of the amorphous semiconductor film, the part being partially superposed on the first polycrystalline semiconductor film and being partially adjacent to the first polycrystalline semiconductor film, with the laser beam, so the second polycrystalline semiconductor film has a larger surface roughness than parts of the first polycrystalline semiconductor film on which the second polycrystalline semiconductor film is not superposed.

7. A method for producing a semiconductor device, comprising:
    forming a first polycrystalline semiconductor film in a first irradiation area by irradiating an amorphous semiconductor film on an insulating material and having a thickness in a range from 60 nm to 100 nm, with a pulsed laser beam having a wavelength of 390 nm and a cross section in an elongated shape, while scanning the laser beam in a direction intersecting a longitudinal direction of the elongated cross section; and
    forming a second polycrystalline semiconductor film in a second irradiation area by irradiating a part of the amorphous semiconductor film, the part being partially superposed on the first polycrystalline semiconductor film and being partially adjacent to the first polycrystalline semiconductor film, with the laser beam, so the second polycrystalline semiconductor film has a larger surface roughness than parts of the first polycrystalline semiconductor film on which the second polycrystalline semiconductor film is not superposed.

8. A method for producing a semiconductor device, comprising:
    forming a first polycrystalline semiconductor film in a first irradiation area by irradiating an amorphous semiconductor film on an insulating material and having a thickness in a range from 50 nm to 200 nm, with a pulsed laser beam having a wavelength of 640 nm and a cross section in an elongated shape, while scanning the laser beam in a direction intersecting a longitudinal direction of the elongated cross section; and forming a second polycrystalline semiconductor film in a second irradiation area by irradiating a part of the amorphous semiconductor film, the part being partially superposed on the first polycrystalline semiconductor film and being partially adjacent to the first polycrystalline semiconductor film, with the laser beam, so the second polycrystalline semiconductor film has a larger surface roughness than parts of the first polycrystalline semiconductor film on which the second polycrystalline semiconductor film is not superposed.

9. A semiconductor device formed by irradiating an amorphous semiconductor film having a thickness in a range from 60 nm to 100 nm and on an insulating material, with a pulsed laser beam having a rectangular irradiation area, while scanning in a direction intersecting a longitudinal direction of the irradiation area, thereby forming a first polycrystalline semiconductor film; and irradiating a part of the amorphous semiconductor film, the part being partially superposed on the first polycrystalline semiconductor film and being partially adjacent to the first polycrystalline semiconductor film, with the laser beam, while scanning in a longitudinal direction, intersecting the irradiation area, thereby forming a second polycrystalline semiconductor film, the second polycrystalline semiconductor film having a larger surface roughness than parts of the first polycrystalline semiconductor film on which the second polycrystalline semiconductor film is not superposed.

10. The semiconductor device according to claim 9, wherein drive voltage of a transistor formed in the second polycrystalline film is lower than that of a transistor formed in a part of the first polycrystalline semiconductor film on which the second polycrystalline film is not superposed.

11. The semiconductor device according to claim 9, wherein the amorphous semiconductor film includes silicon.

12. The semiconductor device according to claim 9, wherein the laser beam is one of a second harmonic of light produced by a Nd:YAG laser, a second harmonic of light produced by a Nd:YVO$_4$ laser, a second harmonic of light produced by a Nd:YLF laser, a second harmonic of light produced by a Nd:glass laser, a second harmonic of light produced by a Yb:YAG laser, a second harmonic of light produced by a Yb:glass laser, light produced by an Ar ion laser, a second harmonic of light produced by a Ti:sapphire laser, and light produced by a dye laser.

13. The semiconductor device according to claim 9, wherein the insulating material is a glass substrate or a quartz substrate.

* * * * *